US012666572B1

(12) United States Patent
Hu et al.

(10) Patent No.: US 12,666,572 B1
(45) Date of Patent: Jun. 23, 2026

(54) CRYOGENIC DATA CENTER RACK

(71) Applicant: PSIQUANTUM, CORP., Palo Alto, CA (US)

(72) Inventors: Hong Hu, Bothell, WA (US); Gabriel Catalano, San Mateo, CA (US); Ilya Vorobeichik, Los Gatos, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 487 days.

(21) Appl. No.: 18/199,763

(22) Filed: May 19, 2023

Related U.S. Application Data

(60) Provisional application No. 63/364,982, filed on May 19, 2022.

(51) Int. Cl.
H05K 7/20 (2006.01)
G02B 6/44 (2006.01)

(52) U.S. Cl.
CPC ....... H05K 7/20372 (2013.01); G02B 6/4452 (2013.01); H05K 7/20809 (2013.01)

(58) Field of Classification Search
CPC ........... H05K 7/20372; H05K 7/20809; G02B 6/4452
See application file for complete search history.

(56) References Cited

U.S. PATENT DOCUMENTS

| | | | | |
|---|---|---|---|---|
| D371,347 | S | * | 7/1996 | Utsuki .......................... D14/310 |
| 9,049,800 | B2 | * | 6/2015 | Shelnutt ............. H05K 7/20318 |
| 9,137,930 | B2 | * | 9/2015 | Alshinnawi ........ H05K 7/20745 |
| D743,968 | S | * | 11/2015 | McClelland ................. D14/441 |
| D798,869 | S | * | 10/2017 | Little ........................... D14/300 |
| D837,207 | S | * | 1/2019 | Widiaman .................... D14/314 |
| 10,575,437 | B1 | * | 2/2020 | Christiansen ...... H05K 7/20818 |
| D917,454 | S | * | 4/2021 | Little ........................... D14/308 |
| D939,497 | S | * | 12/2021 | Huang ......................... D14/314 |
| 11,602,041 | B2 | * | 3/2023 | Gao ........................... G06F 1/20 |
| D1,065,251 | S | * | 3/2025 | Jin .............................. D14/314 |
| 2010/0183408 | A1 | * | 7/2010 | Malin ...................... G01N 1/42 |
| | | | | 414/222.01 |
| 2013/0321162 | A1 | * | 12/2013 | Kohler ................... G06F 1/181 |
| | | | | 340/686.1 |
| 2014/0355201 | A1 | * | 12/2014 | Alshinnawi ........ H05K 7/20736 |
| | | | | 361/679.47 |
| 2019/0032849 | A1 | * | 1/2019 | Seki ........................ F25D 17/02 |
| 2021/0278595 | A1 | | 9/2021 | Kumar |

(Continued)

OTHER PUBLICATIONS

Schiff, D. et al., "Modular Distributed Cryogenic System," International Patent Application No. PCT/US23/21995, filed May 12, 2023.

(Continued)

*Primary Examiner* — Joel M Attey
*Assistant Examiner* — Brahim A. Michael Adeniji
(74) *Attorney, Agent, or Firm* — THE MARBURY LAW GROUP PLLC

(57) ABSTRACT

A cryogenic rack system can contain a vacuum chamber that includes cryogenic cabinets and a distribution section. The cabinets can include cryogenic-temperature blades supporting electronic and photonic chips that operate at cryogenic temperatures, and room temperature blades supporting electronic and photonic chips that operate at a non-cryogenic temperature.

20 Claims, 15 Drawing Sheets

Front Plate 902 Thermal Shield 900 910A 910B 916 Add Thermal Shield

(56) References Cited

U.S. PATENT DOCUMENTS

2021/0278738 A1     9/2021  Kumar
2025/0294704 A1 *   9/2025  Hu ............................ G06F 1/20

OTHER PUBLICATIONS

Licausi, N. et al., "BTO Phase Shifter and Method of Fabrication Thereof," U.S. Appl. No. 63/269,229, filed Mar. 11, 2022.
https://bluefors.com/blog/introducing-kide-large-scale-cryogenic-platform/ viewed on Jun. 30, 2023.
https://www.process-worldwide.com/linde-bluefors-to-develop-cryogenic-cooling-solutions-a-1008249/ viewed on Jun. 30, 2023.
https://www.process-worldwide.com/air-liquide-acquires-80-stake-in-french-firm-cryoconcept-a-966807/ viewed on Jun. 30, 2023.

* cited by examiner

700

Provide cryogenic coolants to common plenum 705

Provide cryogenic coolants to cryochambers 710

Maintain vacuum in common plenum and cryochambers 715

Determine that a chip in cryochamber is malfunctioning 720

Fluidly isolate cryochamber 725

Heat cryochamber 730

Vent cryochamber 735

Open access door 740

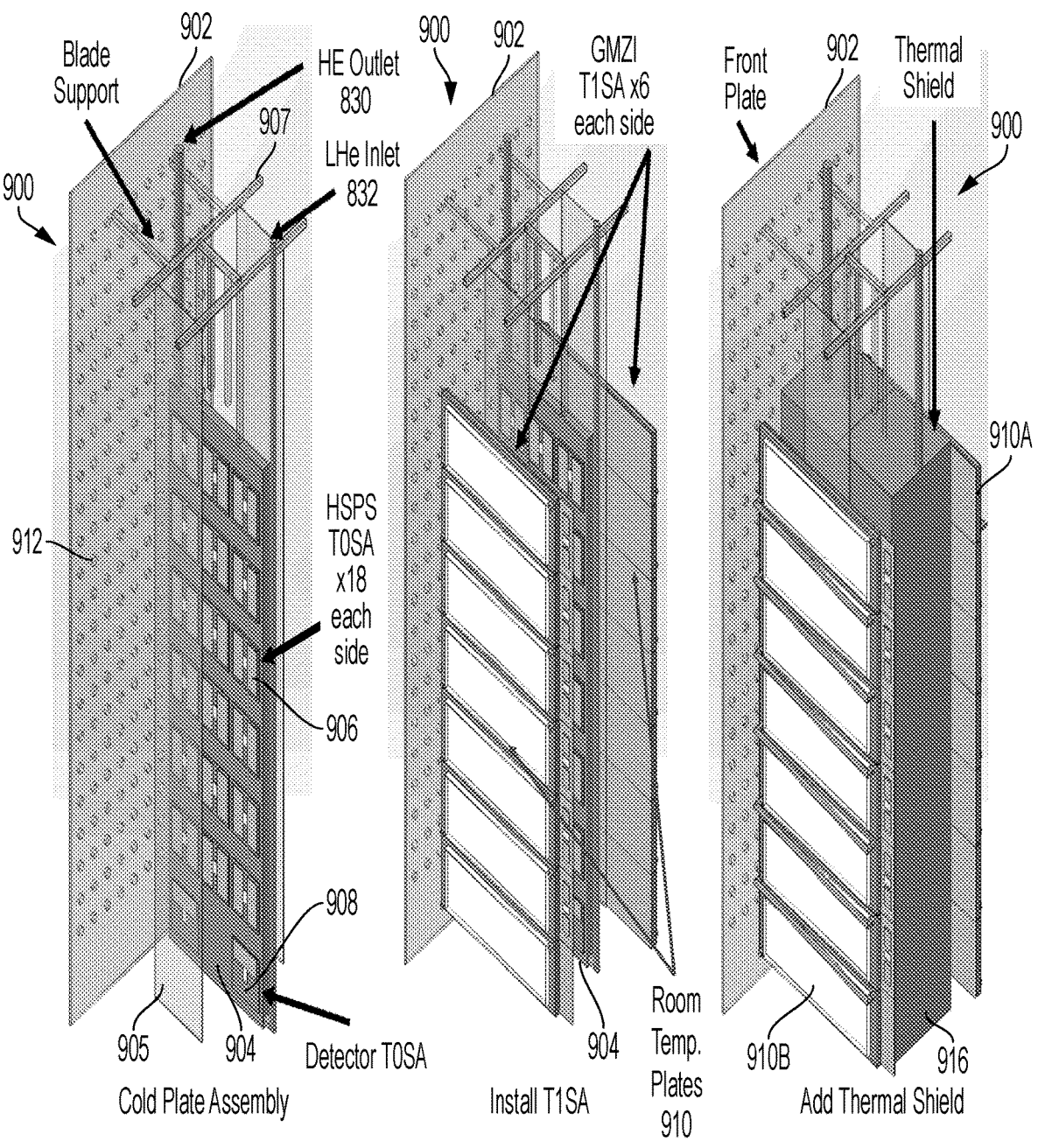
FIG. 9A                    FIG. 9B                    FIG. 9C

Cold Plate Assembly

Install T1SA

Add Thermal Shield

CRYOGENIC DATA CENTER RACK

TECHNICAL FIELD

Embodiments herein relate generally to cryogenic systems, such as cryogenic systems used for quantum computing (QC) applications, having a modular distributed architecture.

BACKGROUND

A cryostat is a device that is used to maintain cryogenic temperatures (e.g., 120° K or less) for objects or materials located within the cryostat. Cryostats have been used for a number of applications in which cryogenic temperatures are desirable and/or necessary. For example, many types of quantum computing systems require quantum processing operations to be performed at extremely low temperatures. A cryostat may be used to house components of the QC system used to perform quantum processing operations such that these components may be maintained within a specified cryogenic temperature range.

SUMMARY

According to one embodiment, a cryogenic quantum computer data center rack includes a vacuum cabinet, cryogenic temperature blades supporting quantum computing photonic chips located in the vacuum cabinet, and room temperature blades supporting electronic control chips located in the vacuum chamber.

BRIEF DESCRIPTION OF THE DRAWINGS

For a better understanding of the various described embodiments, reference should be made to the Detailed Description below, in conjunction with the following drawings in which like reference numerals refer to corresponding parts throughout the Figures.

FIGS. 9A-9C show example vertical blade configurations, in accordance with some example embodiments.

Figure 1:
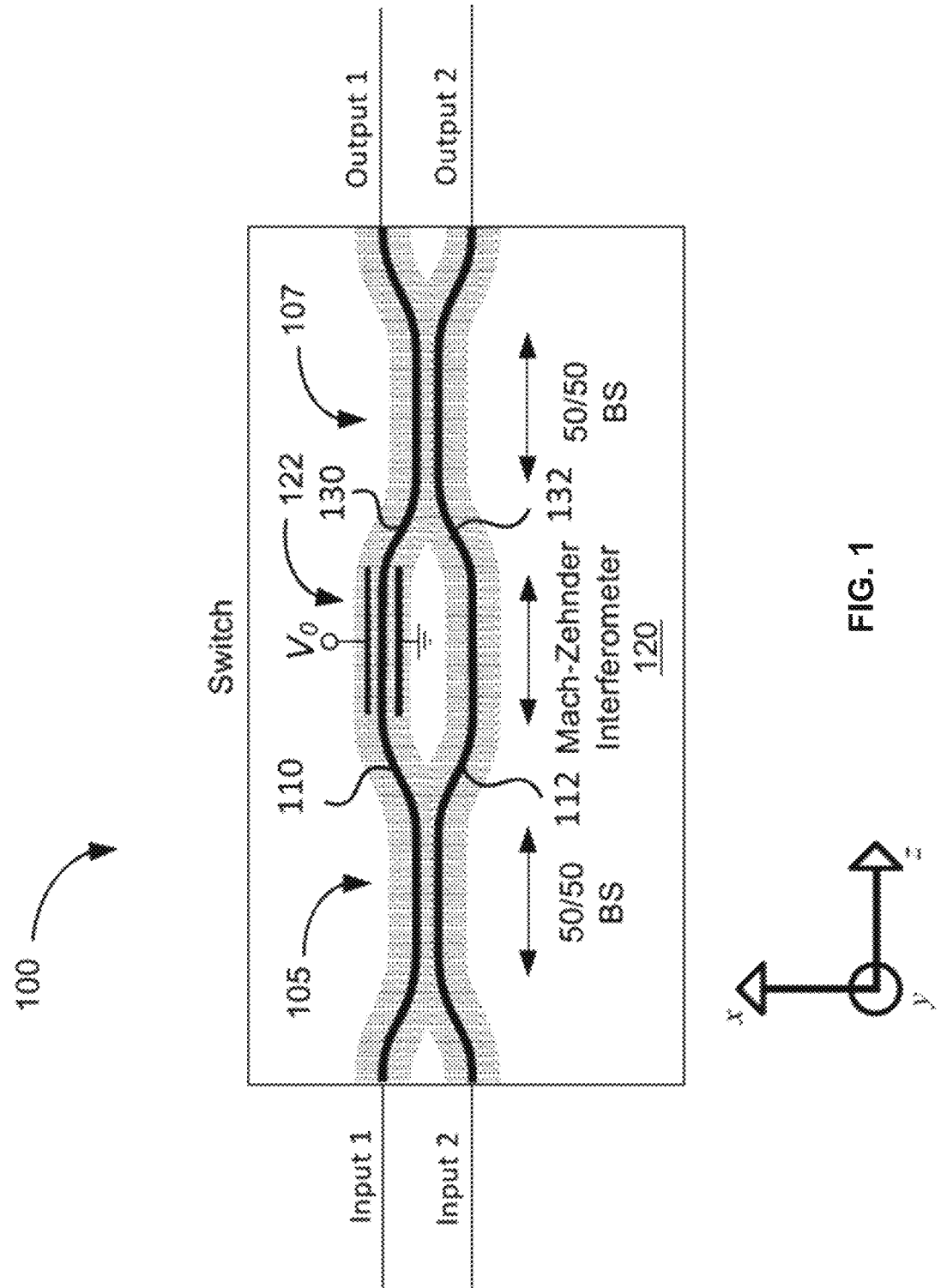
FIG. 1 is a simplified schematic diagram illustrating an optical switch, in accordance with some example embodiments.

While the features described herein may be susceptible to various modifications and alternative forms, specific embodiments thereof are shown by way of example in the drawings and are herein described in detail. It should be understood, however, that the drawings and detailed description thereto are not intended to be limiting to the particular form disclosed, but on the contrary, the intention is to cover all modifications, equivalents and alternatives falling within the spirit and scope of the subject matter as defined by the appended claims.

DETAILED DESCRIPTION

Reference will now be made in detail to embodiments, examples of which are illustrated in the accompanying drawings. In the following detailed description, numerous specific details are set forth to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first electrode layer could be termed a second electrode layer, and, similarly, a second electrode layer could be termed a first electrode layer, without departing from the scope of the various described embodiments. The first electrode layer and the second electrode layer are both electrode layers, but they are not the same electrode layer.

The following description, for purpose of explanation, is described with reference to specific embodiments. However, the illustrative discussions that follow are not intended to be exhaustive or to limit the scope of the claims to the precise forms disclosed. Many modifications and variations are possible in view of the above teachings. The embodiments were chosen to best explain the principles underlying the claims and their practical applications, to thereby enable others skilled in the art to best use the embodiments with various modifications as are suited to the particular uses contemplated.

FIG. 1 is a simplified schematic diagram illustrating an optical switch according to an embodiment of this disclosure. Referring to FIG. 1, switch 100 includes two inputs: Input 1 and Input 2 as well as two outputs: Output 1 and Output 2. As an example, the inputs and outputs of switch 100 can be implemented as optical waveguides operable to support single mode or multimode optical beams. As an example, switch 100 can be implemented as a Mach-Zehnder interferometer integrated with a set of 50/50 beam splitters 105 and 107, respectively. As illustrated in FIG. 1, Input 1 and Input 2 are optically coupled to a first 50/50 beam splitter 105, also referred to as a directional coupler, which receives light from the Input 1 or Input 2 and, through evanescent coupling in the 50/50 beam splitter, directs 50% of the input light from Input 1 into waveguide 110 and 50% of the input light from Input 1 into waveguide 112. Concurrently, first 50/50 beam splitter 105 directs 50% of the input light from Input 2 into waveguide 110 and 50% of the input light from Input 2 into waveguide 112. Considering only input light from Input 1, the input light is split evenly between waveguides 110 and 112.

Mach-Zehnder interferometer 120 includes phase adjustment section 122. Voltage $V_0$ can be applied across the waveguide in phase adjustment section 122 such that it can have an index of refraction in phase adjustment section 122 that is controllably varied. Because light in waveguides 110 and 112 still have a well-defined phase relationship (e.g., they may be in-phase, 180° out-of-phase, etc.) after propagation through the first 50/50 beam splitter 105, phase adjustment in phase adjustment section 122 can introduce a predetermined phase difference between the light propagating in waveguides 130 and 132. As will be evident to one of skill in the art, the phase relationship between the light propagating in waveguides 130 and 132 can result in output light being present at Output 1 (e.g., light beams are in-phase) or Output 2 (e.g., light beams are out of phase), thereby providing switch functionality as light is directed to Output 1 or Output 2 as a function of the voltage $V_0$ applied at the phase adjustments section 122. Although a single active arm is illustrated in FIG. 1, it will be appreciated that both arms of the Mach-Zehnder interferometer can include phase adjustment sections.

As illustrated in FIG. 1, electro-optic switch technologies, in comparison to all-optical switch technologies, utilize the application of the electrical bias (e.g., $V_0$ in FIG. 1) across the active region of the switch to produce optical variation. The electric field and/or current that results from application of this voltage bias results in changes in one or more optical properties of the active region, such as the index of refraction or absorbance.

Although a Mach-Zehnder interferometer implementation is illustrated in FIG. 1, embodiments of this disclosure are not limited to this particular switch architecture and other phase adjustment devices are included within the scope of this disclosure, including ring resonator designs, Mach-Zehnder modulators, generalized Mach-Zehnder modulators, and the like. One of ordinary skill in the art would recognize many variations, modifications, and alternatives.

Figure 2:
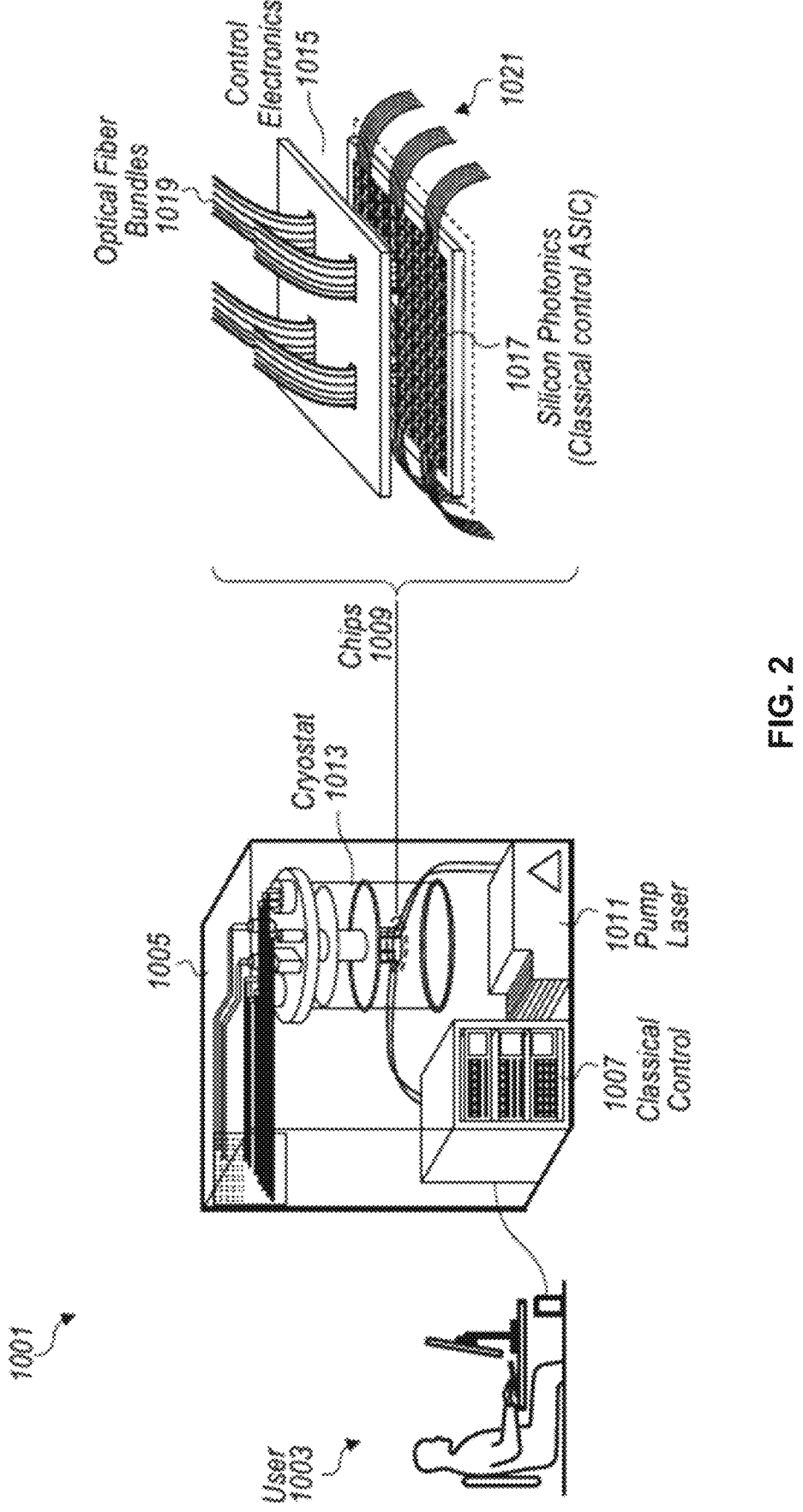
FIG. 2 is an illustration of a user interfacing with a hybrid quantum computing device, in accordance with some example embodiments.

In some embodiments, the optical phase shifter devices described herein may be utilized within a quantum computing system such as the hybrid quantum computing system shown in FIG. 2. Alternatively, these optical phase shifter devices may be used in other types of optical systems. For example, other computational, communication, and/or technological systems may utilize photonic phase shifters to direct optical signals (e.g., single photons or continuous wave (CW) optical signals) within a system or network, and phase shifter architectures described herein may be used within these systems, in various embodiments.

FIG. 2 is a simplified system diagram illustrating incorporation of an electro-optic switch with a prior art cryostat into a hybrid quantum computing system, according to some embodiments. In order to operate at low temperatures, for example liquid helium temperatures, embodiments of this disclosure integrate the electro-optic switches discussed herein (e.g., see FIG. 1) into a system that includes cooling systems. Thus, embodiments of this disclosure provide an optical phase shifter that may be used within a hybrid computing system of the type illustrated in FIG. 2. The hybrid computing system 1001 includes a user interface device 1003 that is communicatively coupled to a hybrid quantum computing (QC) sub-system 1005. The user interface device 1003 may be any type of user interface device, for example, a terminal including a display, keyboard, mouse, touchscreen, and the like. In addition, the user interface device may itself be a computer such as a personal computer (PC), laptop, tablet computer, etc.

In some embodiments, the user interface device 1003 provides an interface with which a user can interact with the hybrid QC subsystem 1005. For example, the user interface device 1003 may run software, such as a text editor, an interactive development environment (IDE), command prompt, graphical user interface, and the like so that the user can program, or otherwise interact with, the QC subsystem to run one or more quantum algorithms. In other embodiments, the QC subsystem 1005 may be pre-programmed and the user interface device 1003 may simply be an interface where a user can initiate a quantum computation, monitor the progress, and receive results from the hybrid QC subsystem 1005. Hybrid QC subsystem 1005 may further include a classical computing system 1007 coupled to one or more quantum computing chips 1009 (e.g., cryogenic quantum information processing chips, cryogenic single photon detector PICs). In some examples, the classical computing system 1007 and the quantum computing chip 1009 (e.g., photonic integrated circuits (PICs), electrical integrated circuits (EICs) can be coupled to other electronic components, e.g., pulsed pump lasers 1011, microwave oscillators, power supplies, networking hardware, etc.

The quantum computing chips 1009 may be housed within a cryostat, for example, cryostat 1013. In some embodiments, each of the quantum computing chips 1009 can include one or more constituent chips, e.g., hybrid electronic chip 1015 and integrated photonics chip 1017. The photonics chip 1017 may include the switch 100 (FIG. 1) for quantum light state preparation and detectors to perform quantum measurements (e.g., superconducting nanowire single photon detectors). Signals can be routed on- and off-chip any number of ways, e.g., via optical interconnects 1019 (e.g., optical fiber bundles, ribbons) and via other electronic interconnects 1021.

Prior art large scale cryogenic distribution systems, such as the ones shown in FIG. 2, do not allow for high numbers of separate payloads to be interfaced and cooled without the entire cryogenic system warming up or changing status. This limits the flexibility of having multiple different cryogenic chambers that can interface devices together due to the different life and service cycles of these devices within the system. Such prior art large scale systems do not have modularity built into the distribution scheme for the cryogenic routing and connections and thus cannot accommodate the increased number of individual payloads. Such cryogenic systems do not allow for the independent warming and cooling and access to individual cryogenic pods because they lack individual modules for payloads.

Figure 3:
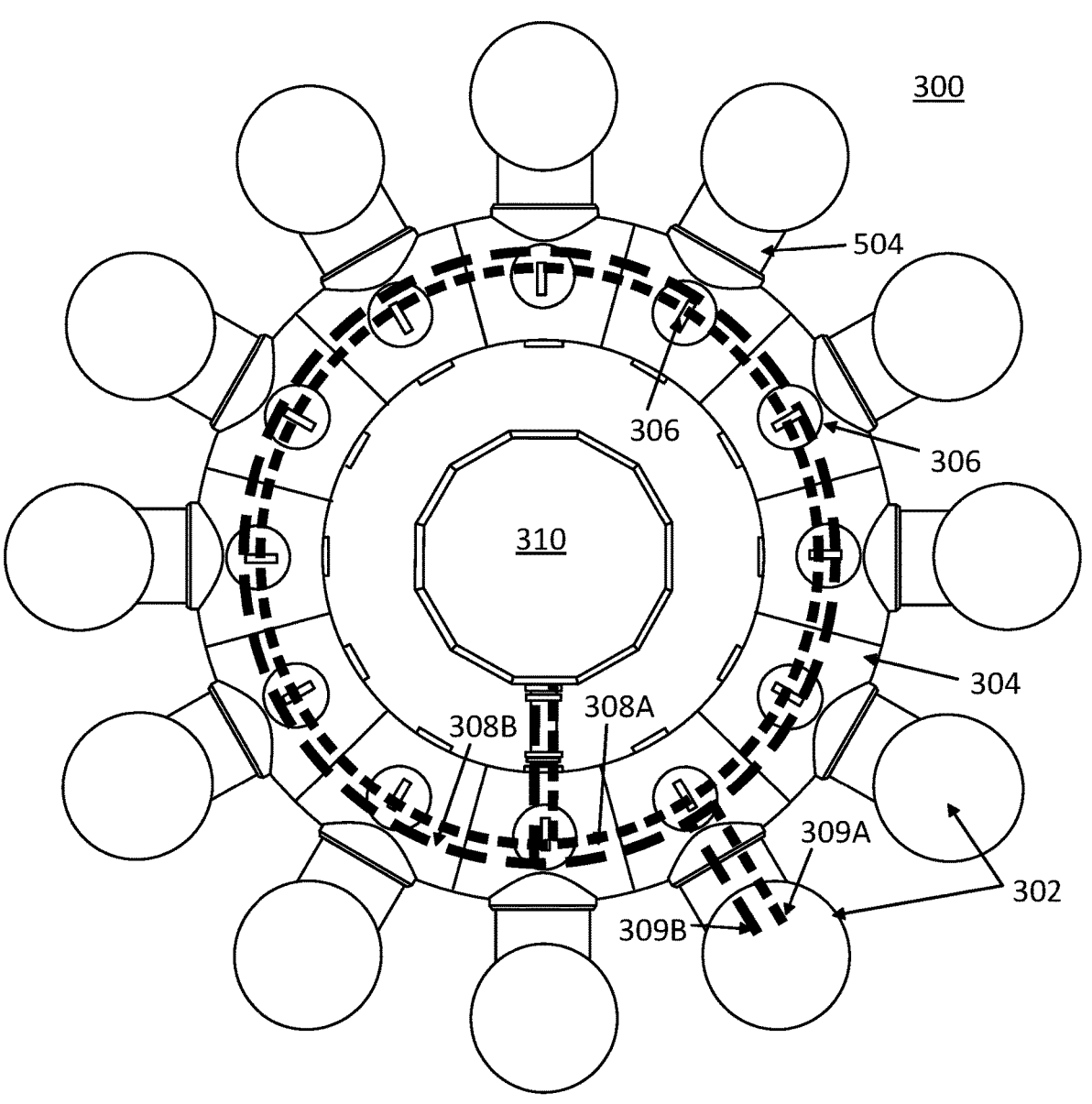
FIG. 3 is schematic a top view of a modular distributed cryogenic distribution system, in accordance with some example embodiments.

Referring to FIG. 3, a modular distributed cryogenic distribution system 300 of one embodiment (e.g., a cryogenic loop or ring system) breaks up the overall cryogenic distribution system into multiple separate cryochambers 302 (e.g., pods) attached to a common chamber 304 (e.g., loop enclosure, toroid, enclosed hoop) housing cryogenic fluid conduits 308A, 308B. The cryogenic fluid conduits 308A, 308B (e.g., pipes) are fluidly connected to the associated valves 306 and feedthrough conduits 309A, 309B into each cryochamber 302 for control. In one embodiment shown in FIG. 3, the common chamber 304 is an enclosure that is shaped as a toroidal loop. However, in other embodiments, the common chamber 304 may have other shapes (e.g., non-loop shapes), such as linear, curved, zig-zag, etc. The common chamber 304 can be maintained at a vacuum to provide a controlled environment to connect each of the cryochambers 302 to one another to implement distributed quantum computing tasks. In some example embodiments, the common chamber 304 comprises the coolant circulant system as well as optical interconnects (e.g., bundles of optical fiber) and electrical interconnects (e.g., cables) to connect the cryochambers through their respective interfaces to the common chamber 304. In some example embodiments, the optical interconnects in the common chamber transfer quantum light (e.g., photonic qubits, resource states, Greenberger-Horne-Zeilinger (GHZ) entangled states) between the chambers and the common chamber 304 provides a controlled environment that protects the optical interconnects from temperature changes and physical movement, which may otherwise disrupt or decohere the quantum light on the optical interconnects.

While two conduits 308A and 308B are shown in dashed lines as extending inside the common chamber 304 (e.g., toroidal loop enclosure), four or more conduits may be provided, as will be described below with respect to FIG. 6. For example, the conduits 308A and 308B may comprise liquid helium inlet and outlet conduits, respectively. If the modular distributed cryogenic distribution system 300 uses both liquid helium and nitrogen, the additional liquid nitrogen inlet and outlet conduits may be provided inside the common chamber 304 enclosure.

In one embodiment shown in FIG. 3, the common chamber 304 may have a circular shape (e.g., when viewed from the top). However, in other embodiments, the common chamber 304 may have a polygonal (e.g., triangular, rectangular, hexagonal, etc.), an oval or an irregular shape.

The embodiment shown in FIG. 3 includes a distribution scheme that is based upon a circular geometry with all the payloads (e.g., the above-described chips 1009) in separate cryochambers (e.g., "pods") 302 arrayed around the outside of the common chamber 304. In other embodiments, the cryochambers 302 may be arrayed inside, above and/or below the common chamber 304 in addition to or instead of outside the common chamber 304. The center of the ring-shaped loop contains a central hub 310 for connection into the larger distribution network 400 of individual modular systems (e.g., different instances of modular distributed cryogenic distribution system 300), as shown in FIG. 4.

Figure 4:
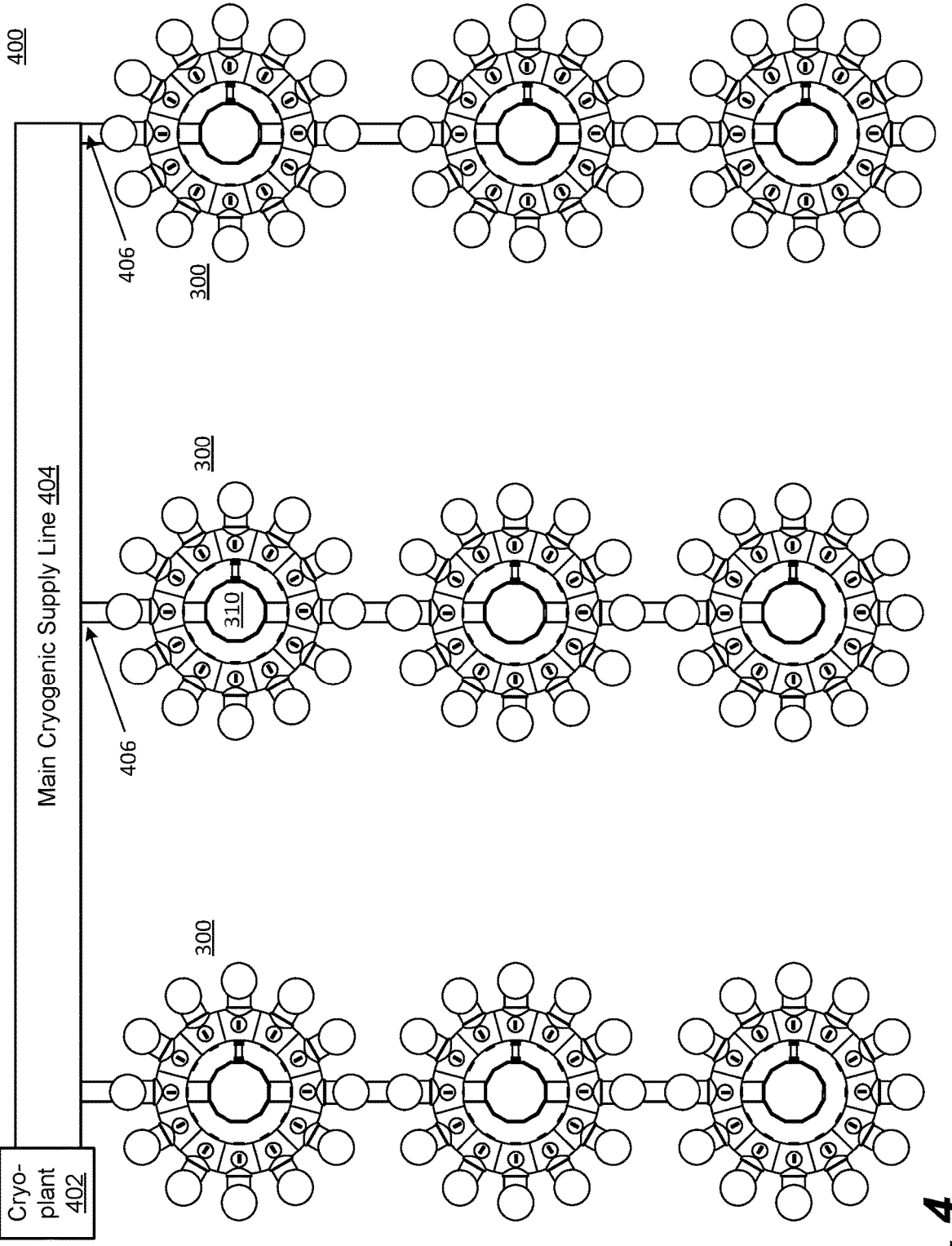
FIG. 4 is a schematic top view of a network of modular distributed cryogenic distribution systems, in accordance with some example embodiments.

As shown in FIG. 4, a main cryoplant 402 provides the cryofluid (e.g., liquid helium and/or nitrogen) into the main cryogenic supply line 404. The main cryoplant 402 may comprise any suitable cryoplant, such as a Stirling cryoplant, pulse tube cryoplant, etc. The cryofluid is distributed from the main cryogenic supply line 404 to branch supply lines 406. The branch lines 406 are fluidly connected to the hubs 310 of the respective modular distributed cryogenic distribution systems (e.g., the modular distributed cryogenic distribution system 300, FIG. 3). In some example embodiments, each branch line comprises a supply line valve 407 to fluidly isolate a set of cryogenic loops from the cryoplant 402. In some example embodiments, the hub 310 comprises a liquid helium coolant storage tank 357A and a liquid nitrogen coolant storage tank 357B for storage and circulation of the different cryogenic coolants. Further, the hub 310 may contain liquefiers (e.g., a condenser/cold head to recondense the cryo-fluid (e.g., helium)), a vacuum pump 353 which maintain the hub 310, the common chamber 304 and the pods at vacuum (e.g., at a pressure of about $10^{-6}$ torr), and valves. The central hub 310 is fluidly connected to the main cryogenic supply line 404 and functions as a buffer and control node for each modular distributed cryogenic distribution system. Thus, the hubs 310 provide control over the attached payloads for the given common chamber 304. In some example embodiments, each hub 310 comprises one or more hub valves 311 to fluidly isolate the hub 310 and therefor the modular distributed cryogenic distribution system 300 from the branch line 406 and cryoplant 402.

Referring back to FIG. 3, each common chamber 304 may be composed of several sections that combine to form the overall loop and provide an interface into the loop for the cryogenic connections and other input/outputs. Each common chamber 304 loop provides independent control over each attached payload in the respective cryochamber 302 using the valves 306. This allows for flexibility within the larger modular distributed cryogenic distribution system 300 to warm up and cool down each modular distributed cryogenic pod on its own timeline (e.g., without warming up or cooling other pods in the same loop).

The modular distributed cryogenic system 300 allows the integration of many pods into a large cryogenic supply of both liquid helium and nitrogen without the disruption of other cryochambers (e.g., cryochamber 302) or the liquefaction of the supply. In some prior art, large scale cryogenic systems, everything is located within one larger module, and everything is cooled down at the same time with very long cooldown times due the large mass within the module. This presents problems for cryogenic systems where cycle times and overall system reliability are important across a high number of cryogenic devices. Incorporating all the cryogenic devices into one substantial module and then pressing cooldown only to have component fail results in all payloads being taken offline.

In contrast, the modular distributed cryogenic distribution system 300 addresses this problem by providing an architecture that can scale up the modular distributed cryochambers (e.g., cryochamber 302) and/or independently service or take offline individual pods to meet the overall system size required instead of just waiting on one massive chamber.

Thus, each distributed cryogenic pod is just one section of a loop (e.g., ring) that can contain more pods as the radius of the common chamber 304 increases. Each pod is a section of the common chamber 304, and each common chamber 304 is connected to the large cryogenic supply lines through the hub 310. The pods have control valves 306 to turn off and on the flow of the cryofluid (e.g., liquid helium and nitrogen) into the cryochamber 302 from the common chamber 304.

Depending on the overall desired system size, each modular distributed cryogenic distribution system 300 may have a desired number of pods, and the number of modular distributed cryogenic distribution systems in the network 400 can be varied to meet the level of flexibility desired for cycle time and testing. During normal full system operation, all the valves 306 are open and the devices (e.g., the chips 1009) within the cryochambers (e.g., cryochamber 302) are interfaced to the cooling mechanism (e.g., the main cryoplant 402). When a fault is detected and a need arises to open one pod, the valves 306 for the specific pod close and heaters (described below) bring the cryochamber 302 (e.g., individual pod) to ambient conditions allowing for service access once vented (e.g., raised to atmospheric pressure) via pod vent 517 (e.g., to room temperature, ambient pressure of the room or environment), while the rest of the pods in the modular distributed cryogenic distribution system 300 continue to operate at cryogenic temperatures.

If a larger number of pods require service or changeover, the modular distributed cryogenic distribution system 300 can be closed off from the main cryogenic supply line 404 or the branch line 406 by closing valves in the respective modular distributed cryogenic distribution system 300 and hub. A similar heating and venting process can be applied to the modular distributed cryogenic distribution system 300, while the other systems in the network 400 continue to operate at cryogenic temperatures.

The modular distributed cryogenic system 300 and network 400 of systems 300 provide an improved level of control and access compared to prior art large-scale cryogenic systems. The modular distributed cryogenic distribution system 300 is suitable for the quantum computer described above to interface many devices (e.g., chips 1009) to a cryocooling source while maintaining a degree of flexibility for cycle time and accessibility.

The cryochambers (e.g., cryochamber 302) may contain their own set of valves 306, heaters (described below), and feedthroughs that connect into the common chamber 304 of the modular distributed cryogenic distribution system 300 through a respective bulkhead 504 (e.g., bulkhead interface to ta given pod). This allows each separate pod to go through an independent warm up and cool down cycle. Each pod may contain its own bulkhead 504 for the feedthroughs, as described below. In some example embodiments, each pod further comprises a rough pump valve 521 to couple to a vacuum pump (e.g., rough pump, manual pump) of the pod to place the pod in low or rough vacuum before the pod vacuum valve 510 (e.g., gate valve) is opened to the loop chamber. In this way, the ambient pressure in the cryochamber 302 (e.g., air from the environment in which the pod operates) is removed or mitigated and does not rush into the common chamber, and does not further rush into the other pods, which are vacuum coupled to the common chamber 304.

Figure 5B:
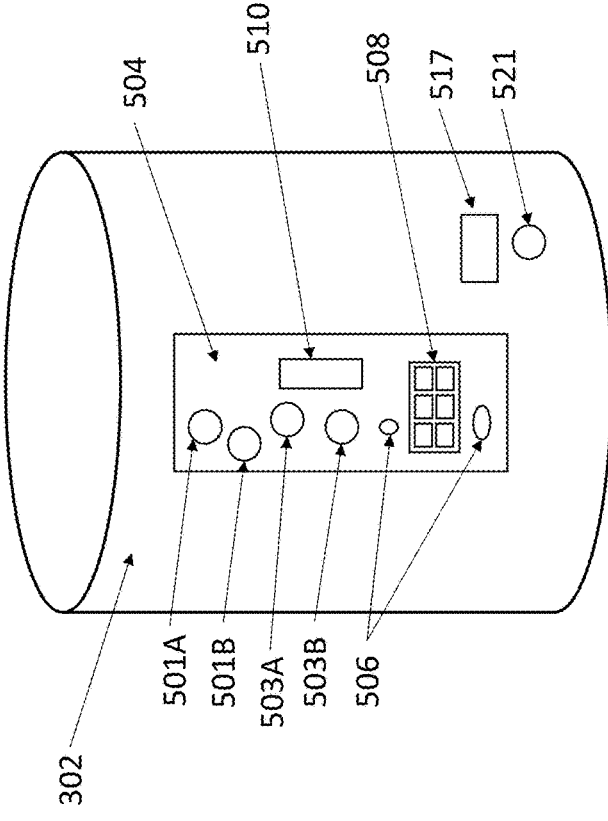
FIGS. 5A and 5B are rear and front perspective views, respectively, of one pod of the modular distributed cryogenic distribution system, in accordance with some example embodiments.
Figure 5A:
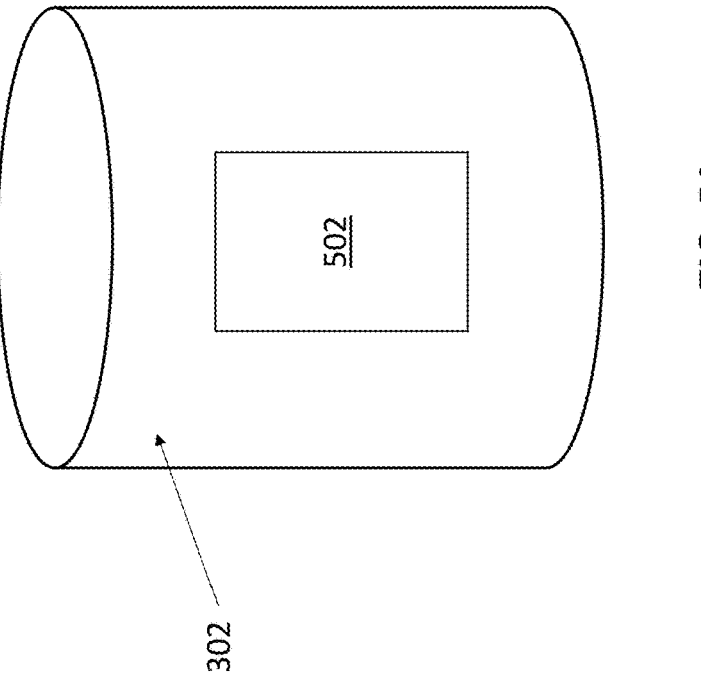

FIGS. 5A and 5B illustrate the rear and front views of one of the cryochambers, in accordance with some example embodiments. As shown in FIG. 5A, the back (rear) side of the cryochamber 302 which faces away from the common chamber (e.g., loop) 304 has an access door 502. The access door 502 may be opened by service personnel to service the components inside the cryochamber 302.

As shown in FIG. 5B, the front side of the cryochamber 302 which faces the common chamber 304 contains the bulkhead 504. The bulkhead 504 provides access from the common chamber 304 to the cryochamber 302. The bulkhead 504 may contain various feedthroughs (e.g., openings). In other embodiments, if the cryochamber 302 is located below the common chamber 304 instead of radially outwards of the common chamber 304, then the bulkhead 504 may be located on top of the cryochamber 302 instead of on the front side of the cryochamber 302.

Figure 6:
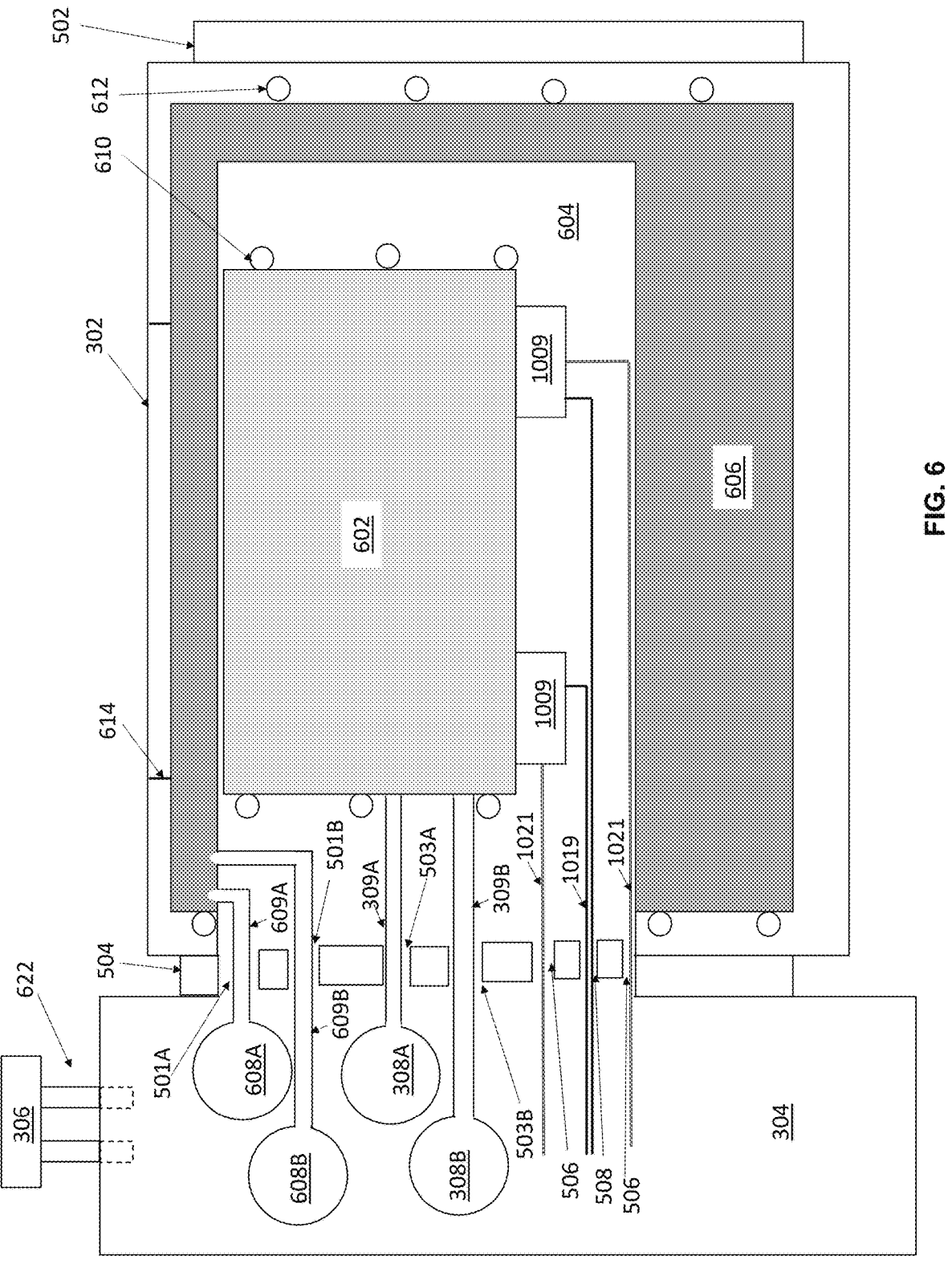
FIG. 6 is a side cross-sectional view of a cryochamber pod, in accordance with some example embodiments.

As shown in FIGS. 5B and 6, the common chamber 304 may comprise a vacuum chamber which houses liquid nitrogen inlet 608A and liquid nitrogen outlet 608B, respectively (e.g., cryogenic fluid conduits). Liquid nitrogen inlet 608A and liquid nitrogen outlet 608B have corresponding feedthrough conduits 609A and 609B (e.g., pipes that are sealed through the bulkhead) may extend through their respective bulkhead feedthroughs 501A and 501B of the bulkhead 504. The fluid feedthrough conduits 609A and 609B are fluidly connected through the bulkhead feedthroughs to the liquid nitrogen inlet 608A and liquid nitrogen outlet 608B, respectively, which are located inside the common chamber 304.

Liquid helium inlet and outlet fluid feedthrough conduits 309A and 309B may extend through their bulkhead respective feedthroughs bulkhead 503A and 503B in the bulkhead 504. The fluid feedthrough conduits 309A and 309B (e.g., pipes) are fluidly connected through the feedthroughs to the liquid helium inlet and outlet conduits 308A and 308B (e.g., looped pipes in the ringed common chamber), respectively, which are located inside the common chamber 304. The common chamber 304 can include the valves 306 to control circulation of the cryogenic coolants to the pods. In some example embodiments, the valves 306 comprise actuators or motors and arms 622 that extend down into the plenum to access and control valves to shut off or open respective cryogenic pipes (e.g., liquid nitrogen inlet 608A and liquid nitrogen outlet 608B, cryogenic fluid conduits 308A, 308B).

The bulkhead 504 further comprises a vacuum valve 510 that can open or close the cryochamber to the pressure system of the common chamber. For example, the vacuum valve 510 can be opened and the vacuum pump of the hub 310 can pump the common chamber and any cryochambers with open vacuum valves to put the common chamber and cryochambers in a low-pressure vacuum state.

In an optical bulkhead interface, optical interconnects 1019 (e.g., optical fiber bundles) extend from the common chamber 304 into the cryochamber 302 through optical feedthroughs 508 (e.g., optical ribbon cable couplers). In an electrical bulkhead interface, the electronic interconnects 1021 (e.g., direct current (DC) and/or radio frequency (RF) buses and/or wires) extend from the common chamber 304 into the cryochamber 302 through electrical feedthroughs 506. The interconnects may pass from the common chamber 304 into the central hub 310 and then out to the remaining quantum computer components described above. In the side view of FIG. 6, the vacuum valve (e.g., gate valve) between the cryochamber 302 and the common chamber 304 is not shown, however it is appreciated that the vacuum interface between the cryochamber 302 and the common chamber 304 can include a valve to fluidly isolate the chamber from the common chamber.

As shown in FIG. 6, the cryochamber 302 contains a liquid helium chamber 602, a vacuum plenum 604 and a liquid nitrogen chamber 606. The liquid helium chamber 602 contains liquid helium during operation of the modular distributed cryogenic distribution system 300. The liquid helium is cycled to the liquid helium chamber 602 through conduits 308A and 309A, and is cycled away from the liquid helium chamber 602 through conduits 308B and 309B. Thus, liquid helium is routed to and from the liquid helium chamber 602 via conduits 308A and 308B located in the common chamber 304 and through feedthrough conduits 309A and 309B which extend from the common chamber 304 into the cryochamber 302 through the bulkhead 504.

The liquid helium chamber 602 may be located in the vacuum plenum 604 of the cryochamber 302. The vacuum plenum 604 may be fluidly connected to the common chamber 304 via the feedthroughs in the bulkhead 504. Thus, when the common chamber 304 is pumped down to a vacuum (e.g., by a vacuum pump located in the hub 310), the vacuum plenum 604 is also pumped down to vacuum at the same time. The feedthrough conduits 309A and 309B may be fluidly connected to the liquid helium chamber 602 through the bulkhead 504 to cycle liquid helium to and from the chamber 602.

The quantum computing chips 1009 described above may be placed in thermal contact (such as direct or indirect physical contact) with the liquid helium chamber 602. For example, the quantum computing chips 1009 may be attached directly or via an interposer to the bottom of the liquid helium chamber 602. In other embodiments, the chips 1009 may be placed on different surface(s) of the liquid helium chamber 602, such that the liquid helium in chamber 602 cools the chips 1009 to a temperature of 4.2 K or below, such as 2-4K. Thus, the chips 1009 may be located in the vacuum plenum 604 below the liquid helium chamber 602.

The optical interconnects 1019 (e.g., optical fiber bundles) and the electronic interconnects 1021 are connected to the chips 1009 (e.g., from below and/or from the sides). The optical interconnects 1019 and the electronic interconnects 1021 extend through the vacuum plenum 604 to the respective feedthroughs in the bulkhead 504.

The liquid nitrogen chamber 606 may at least partially surround the vacuum plenum 604 and the liquid helium chamber 602. The liquid nitrogen chamber 606 provide a thermal shield to the liquid helium chamber 602. The fluid feedthrough conduits 609A and 609B cycle liquid nitrogen to and from the liquid nitrogen chamber 606. The liquid nitrogen chamber 606 may include a nitrogen shield and contain liquid nitrogen during operation, which is maintained at a temperature of about 77K.

A first heater 610 may be located adjacent to liquid helium chamber 602 to warm up the chamber 602 when the cryochamber 302 is being serviced or shut off. A second heater 612 may be located adjacent to liquid nitrogen chamber 606 to warm up the chamber 606 when the cryochamber 302 is being serviced or shut off. The heaters 610 and 612 may comprise independently controlled resistive heaters which are located at least one sidewalls of their respective chambers.

The liquid helium chamber 602, the vacuum plenum 604 and/or the liquid nitrogen chamber 606 may be attached to the cryochamber 302 using any suitable mechanical connections. For example, they may be suspended from the top of the cryochamber 302 using rods 614. Alternatively, they may be attached to the bottom and/or the side of the pod using one or more of rods, plates, brackets, etc.

Thus, the modular distributed cryogenic distribution system 300 of one embodiment, and the network 400 of such systems 300 described above, may be used in a quantum computing device described above. The modular distributed cryogenic distribution system 300 contains separate cryopods housing photonic and electronic chips 1009 of the quantum computing device.

Figures 7A, 7B:
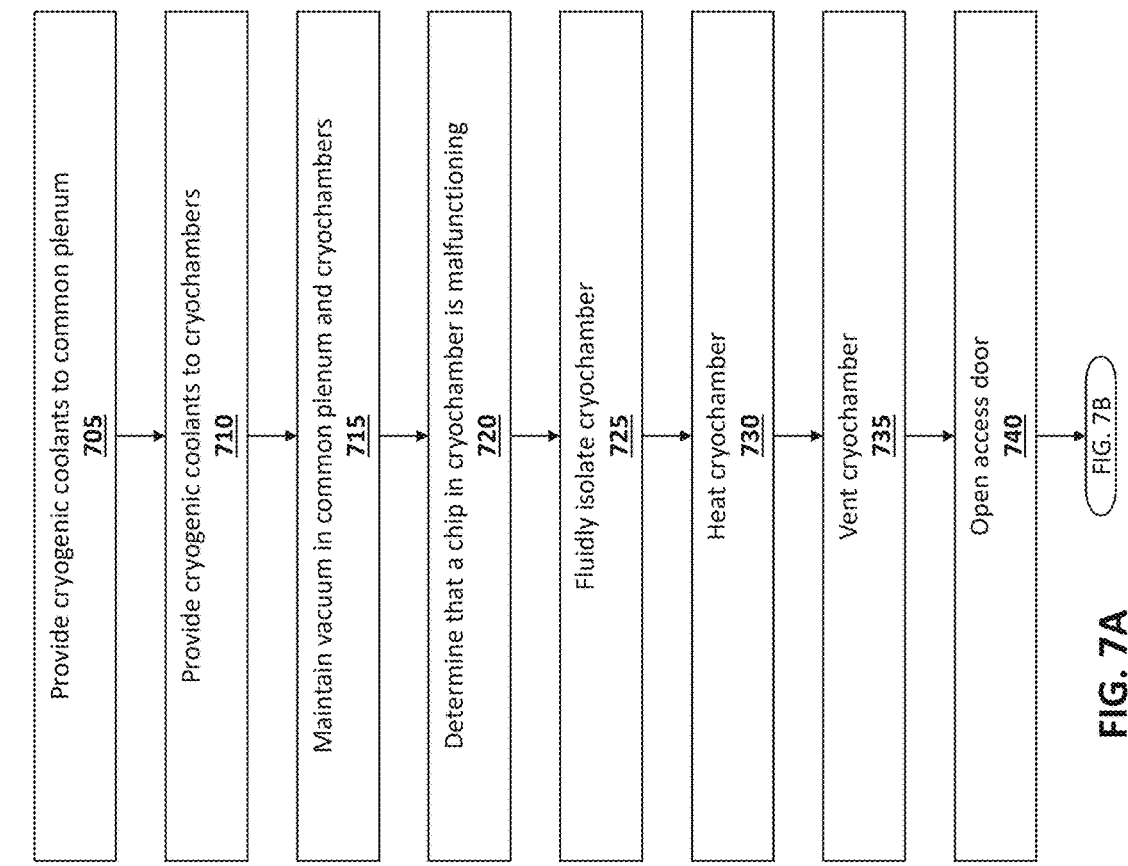
FIGS. 7A and 7B show a flow diagram of a method for implementing a modular distributed cryogenic system, in accordance with some example embodiments.
Figure 7B:
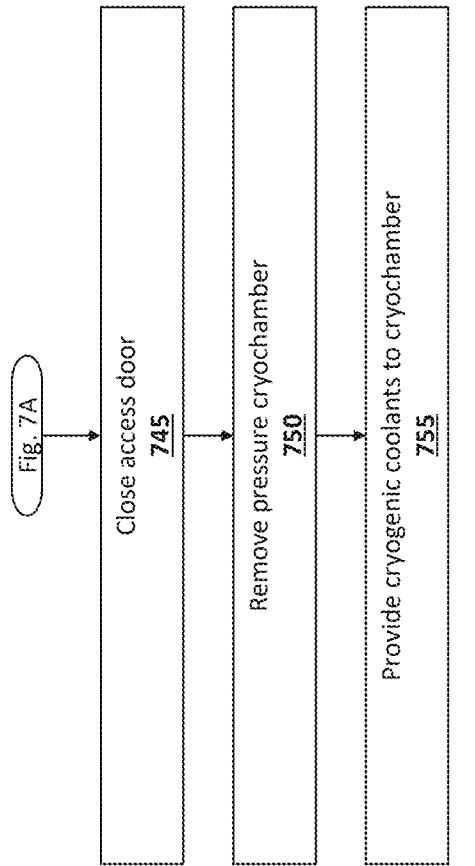

FIGS. 7A and 7B show a flowchart of an example method 700 for implementing a modular cryogenic system, in accordance with some example embodiments. As shown in FIG. 7A, the method 700 may include providing a plurality of different cryogenic coolants to a common chamber that may include cryogenic fluid conduits to circulate the plurality of different cryogenic coolants (block 705). For example, the hub 310 may provide a plurality of different cryogenic coolants to a common chamber 304 that may include cryogenic fluid conduits (e.g., pipes) to circulate the plurality of different cryogenic coolants (e.g., liquid helium, liquid nitrogen), as described above.

As also shown in FIG. 7A, the method 700 may include providing the plurality of different cryogenic coolants from the cryogenic fluid conduits to a plurality of cryochambers (e.g., cryochamber 302) that are connected to the common chamber 304. In some embodiments, cryochamber houses quantum chips, such as one or more cryogenic quantum information processing chips that are cooled to a cryogenic temperature by the plurality of different cryogenic coolants (block 710). As further shown in FIG. 7A, method 700 may include maintaining a vacuum in the common chamber and the plurality of cryochambers using a vacuum pump 353 that pumps the common chamber 304 and cryochambers with open vacuum valves (block 715). As also shown in FIG. 7A, the method 700 may include determining, using one or more processors (e.g., classical control 1007, terminal, desktop computer), a cryogenic quantum information processing chip in one of the cryochambers is malfunctioning (block 720). For example, classical control 1007 may receive an error flag from a control unit that monitors the operation of the malfunctioning chip. As further shown in FIG. 7A, method 700 may include actuating valves 306 to fluidly isolate the one of the cryochambers (block 725). As also shown in FIG. 7A, the method 700 may include activating heaters (e.g., heaters 610, heaters 612) inside the one of the cryochambers to raise a temperature of the one of the cryochambers (block 730). In some example embodiments, heating is optional and the after fluidly isolating the chamber, the chamber is vented.

As further shown in FIG. 7A, the method 700 may include venting the one of the cryochambers (e.g., via vent 517, FIG. 5B) such that the one of the cryochambers is set to ambient pressure (block 735). As also shown in FIG. 7A, method 700 may include opening an access door 502 to the one of the cryochambers to replace the cryogenic quantum information processing chip with a replacement cryogenic information processing chip (block 740).

With reference to FIG. 7B, the method 700 may include closing the access door 502 (block 745) to ready the chamber for cooling and vacuum pumping. As also shown in FIG. 7B, method 700 may include removing pressure from the one of the cryochambers using the vacuum pump that manages the vacuum in the common chamber (block 750). For example, device may remove pressure from the one of the cryochambers using the vacuum pump 353 that manages the vacuum in the common chamber, as described above.

As further shown in FIG. 7B, the method 700 may include actuating the valves 316 to provide the plurality of different cryogenic coolants to the one of the cryochambers to lower a temperature of the one of the cryochambers to the cryogenic temperature (block 755). In some example embodiments, the same or similar processes of method 700 are implemented to shut down a ring of cryochambers or sets of loop cryochambers systems by opening and shutting hub valve or supply line valves, optionally heating, and venting the specific rings or pods, thereby allowing modularized access to a cryogenically cooled, electro-optical computation system in an efficient manner (e.g., without shutting down the cryoplant or the entire system). Although FIGS. 7A and 7B show example blocks of method 700; in some implementations, method 700 may include additional blocks, fewer blocks, different blocks, or differently arranged blocks than those depicted in FIGS. 7A and 7B. Additionally, or alternatively, two or more of the blocks of method 700.

In some example embodiments, a server rack style cryostat with blade-based high-density packing of cryogenic and room temperature electro-optical assemblies is provided. The cryogenic cabinet rack system is configured to house a high number of quantum computing chips 1009 into a given volume, where the chips are configured to operate in a cryogenic environment (e.g., below 120 degrees Kelvin). In some example embodiments, the cryogenic cabinet rack system comprises vertically assembled blade-style racks to mount the quantum computing chips 1009. In some example embodiments, the rack system is arranged in a helium-4 configuration (e.g., thermosiphon cryogenic technology). In other example embodiments, the rack system can be configured as a dilution refrigeration configuration. In accordance with some example embodiments, in the helium-4 configuration, there are two arrangements of cryo-chips (e.g., T0SA: low temperature "T0" sub-assemblies): one arrangement at cryogenic temperatures, one at a higher non-cryogenic or room temperature. In some example embodiments, the rack system comprises a cryo-cabinet (e.g., vacuum chamber and liquid cryogen vessel) and multiple cryo-blades (e.g., liquid cooled cold plates).

Figure 8A:
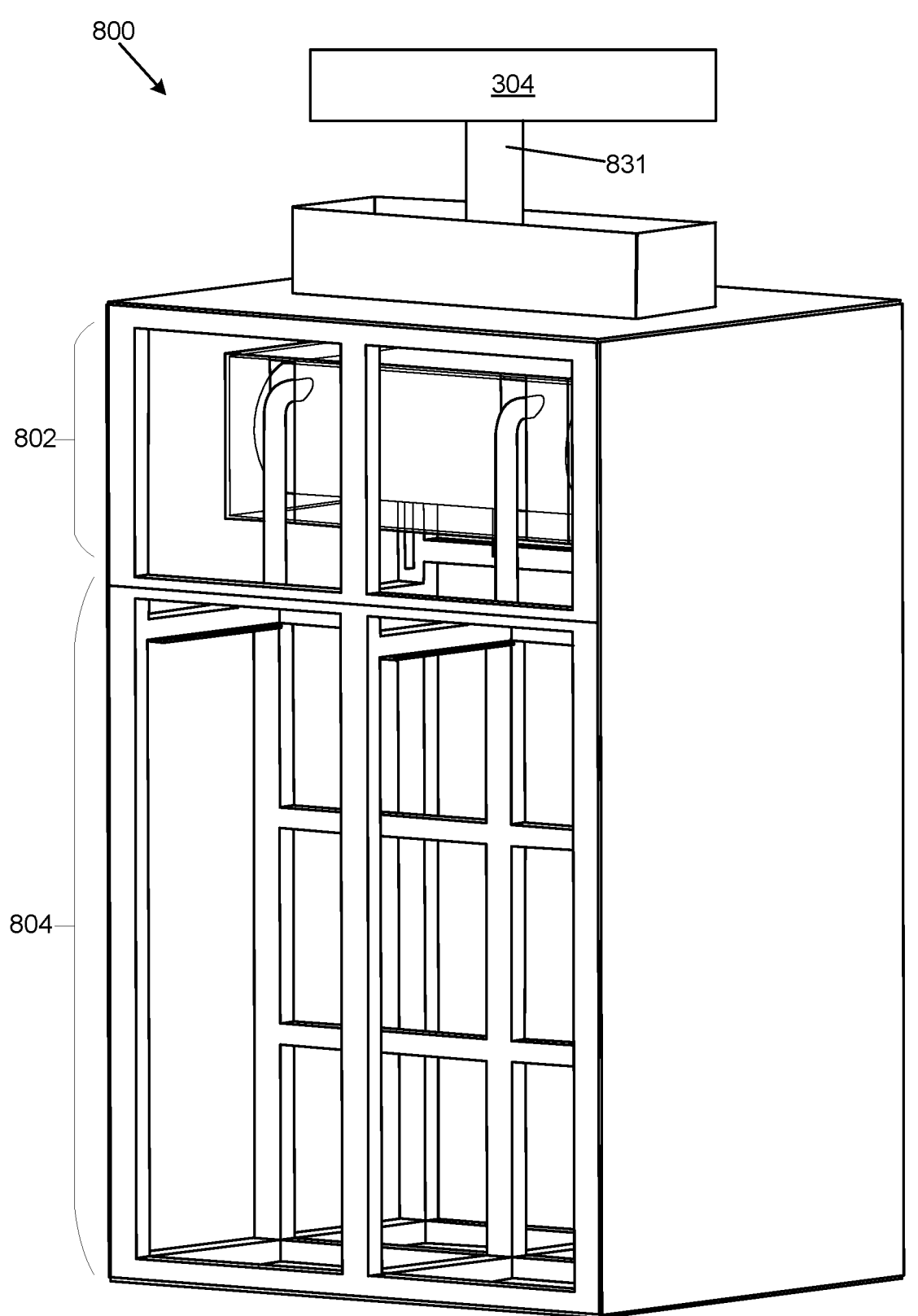
FIG. 8A is a perspective view of a cryo-rack system, in accordance with some example embodiments.
Figure 8B:
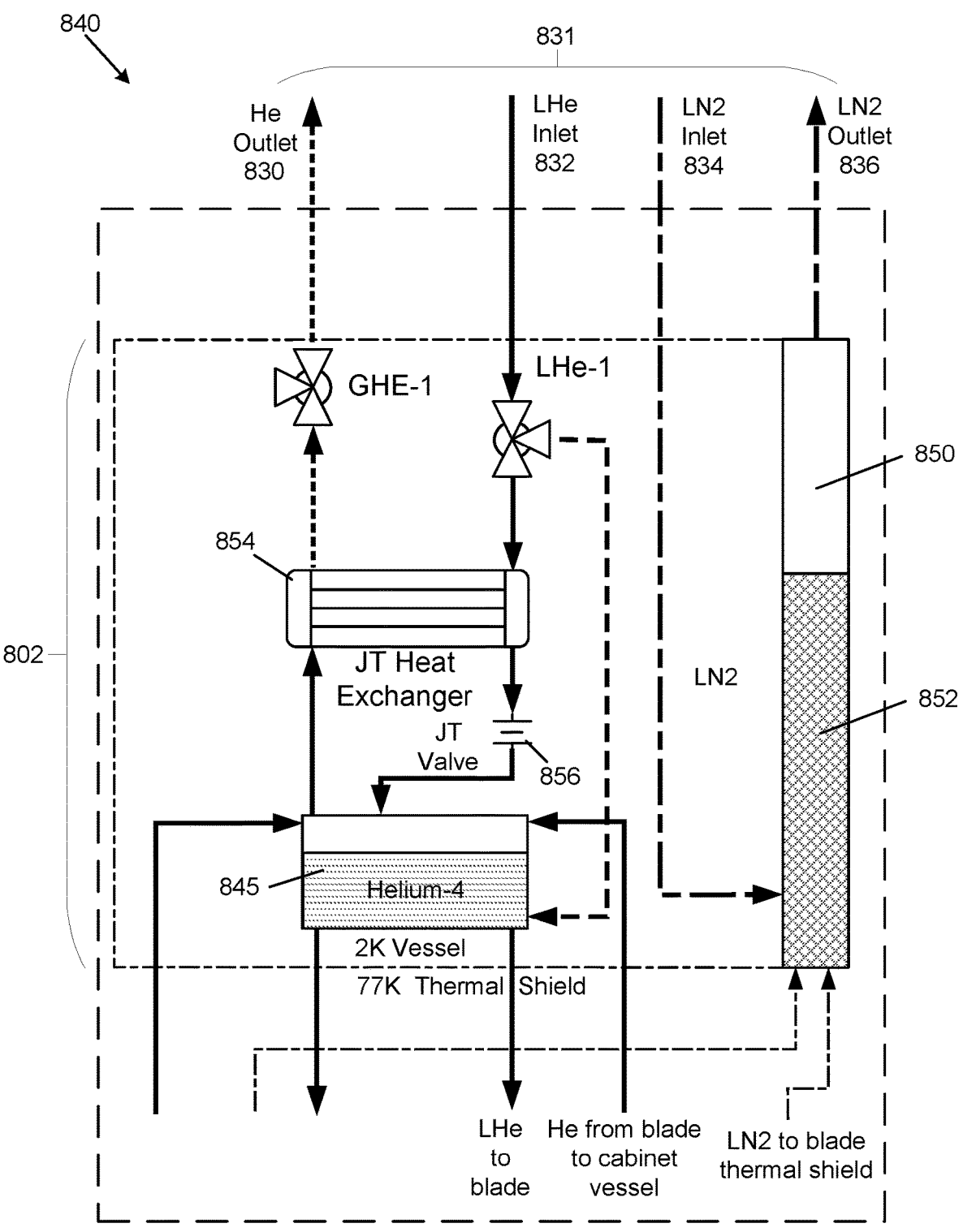
FIG. 8B is a system diagram of control systems, in accordance with some example embodiments.

FIG. 8A shows an example cryogenic cabinet rack system 800 (e.g., cryogenic quantum computer data rack system) without blades, in accordance with some example embodiments. In the illustrated example, the cryogenic cabinet rack system 800 can house four cryostat blade towers (e.g., blade cabinet 900, FIG. 9; blade tower 1285, FIG. 12B) in a tower cabinet area 804 of the cryogenic cabinet rack system 800. An example cryo-cabinet system diagram 840 is shown in FIG. 8B. The cryogenic cabinet rack system 800 comprises a distribution head section 802 that comprises tanks and control systems (e.g., valves) to input and output fluids from the plurality of towers. The distribution top section 802 and the tower cabinet area 804 are part of a single vacuum chamber, in accordance with some example embodiments. The cryogenic cabinet rack system 800 can be implemented as a single cryopod (e.g., pod, cryochamber 302), in which the cryogenic cabinet rack system 800 one or more fluid conduits 831 to couple to the common chamber 304 as discussed above (e.g., for vacuum pumping, to couple in and couple out cryogenic fluids). The cryogenic cabinet rack system 800 has a liquid helium-4 vessel 845 (e.g., tank) and a liquid nitrogen cooled thermal shield 850, where the distribution thermal shield 850 is cooled by a liquid nitrogen vessel 852 (e.g., tank, LN2 vessel, one or more LN2 tubes), all housed in the cryogenic cabinet rack system 800 under vacuum (e.g., $10^-6$ millibar) for thermal isolation and convection mitigation. The liquid helium and liquid nitrogen are supplied from a cryoplant in some example embodiments. The helium outlet 830, liquid helium inlet 832, liquid nitrogen inlet 834, and liquid helium outlet 836 can couple the cryo-fluids into and out of the cryogenic cabinet rack system 800. A helium valve 877 (e.g., liquid helium valve) and second helium valve 879 (e.g., helium gas valve) may further be implemented to couple the helium into and out of the cabinet. The helium outlet 830 is connected to a helium-4 recovery system. A Joule-Thompson (JT) heat exchanger 854 and JT valve 856 are implemented to bring the liquid helium saturation temperature to sub 4K (e.g., enable liquid helium working at sub-atmosphere region, where saturation temperature is below 4 k). In some example embodiments, the cryogenic blade is thermally connected to the main helium vessel and liquid nitrogen cooled thermal shield but is physically separated except for pipes (cryo-pipes).

FIGS. 9A-9C show an example cryo-blade tower 900, in accordance with some example embodiments. In particular, FIG. 9A shows the cryogenic blade 904 (e.g., metal cold plate assembly, primary cold plate, cryogenic plate); FIG. 9B shows an installation of the room temperature blades 910 (e.g., higher temperature "T1" chips (T1SA), metal non-cryogenic blades having water circulation pipes for water cooling, electronic and photonic chip higher temperature blades); and FIG. 9C shows an installation of the liquid nitrogen cooled thermal shield 916 (e.g., cryo-blade thermal shield, copper thermal radiation shield). The blade cabinet 900 has a cryogenic blade 904 in the middle to mount photonic chips (e.g., chip 1017) with photonic integrated circuit (PIC) single photon sources 906 and PIC superconducting single photon detectors 908. The liquid helium inlet 832 and helium outlet 803 (e.g., Helium gas outlet) are two pipes that connect to the cryogen vessel (e.g., Helium tank or vessel). In some example embodiments, a cryogenic pipe is routed around the perimeter of the cryogenic blade 904. The room temperature control electronics (e.g., chip 1015) are installed on two room temperature blades 910 adjacent and parallel to the cryogenic blade 904. The blades can be rigidly attached (e.g., with fasteners) to structural panels and frames, such metal panel 905 and frame 907. The structural supports (e.g., panels and frames) can be attached to the cryo-rack system, or attached inside a single tower cabinet that slides in and out from the rack system (e.g., tower rack system 800). In some embodiments, the room temperature blades 910 are cooled by flowing room temperature water or dielectric fluid around pipes of the room temperature blades 910 (water pipes not depicted) to prevent overheating of electrical equipment in vacuum where air cooling is not available. In some example embodiments, optical interconnects (e.g., fiber optic cables) and electrical interconnects (e.g., ribbon cable, electrical wiring) is connected to the chips inside the cabinet through a plurality of feedthroughs 912 of an access panel 902 for the blade 900. In some example embodiments, the cabinet includes a blade support metal frame structure 933 to support the cabinet in the larger cryo-cube system (e.g., cryogenic cabinet rack system 800). It is appreciated that the room temperature blades 910 may in some environments have a temperature that is the same as the physical environment in which the cabinet is located (e.g., data center room), and further the room temperature blades 910 may be colder than the surrounding environment temperature due to the dielectric or water cooling).

In the between of cryogenic electronics on the cryogenic blade 904 and room temperature electronics on the room temperature blades 910, there is a cryogenically cooled thermal shield 916 to reduce the radiation heat transfer and provide thermal lagging for cables and wires running between the room temperature blades 910 and cryogenic blade 904. In accordance with some example embodiments, each thermal shield 916 is thermally connected to a larger thermal shield encompassing most of the volume of the cryo-cabinet.

Figures 10A, 10B, 10C:
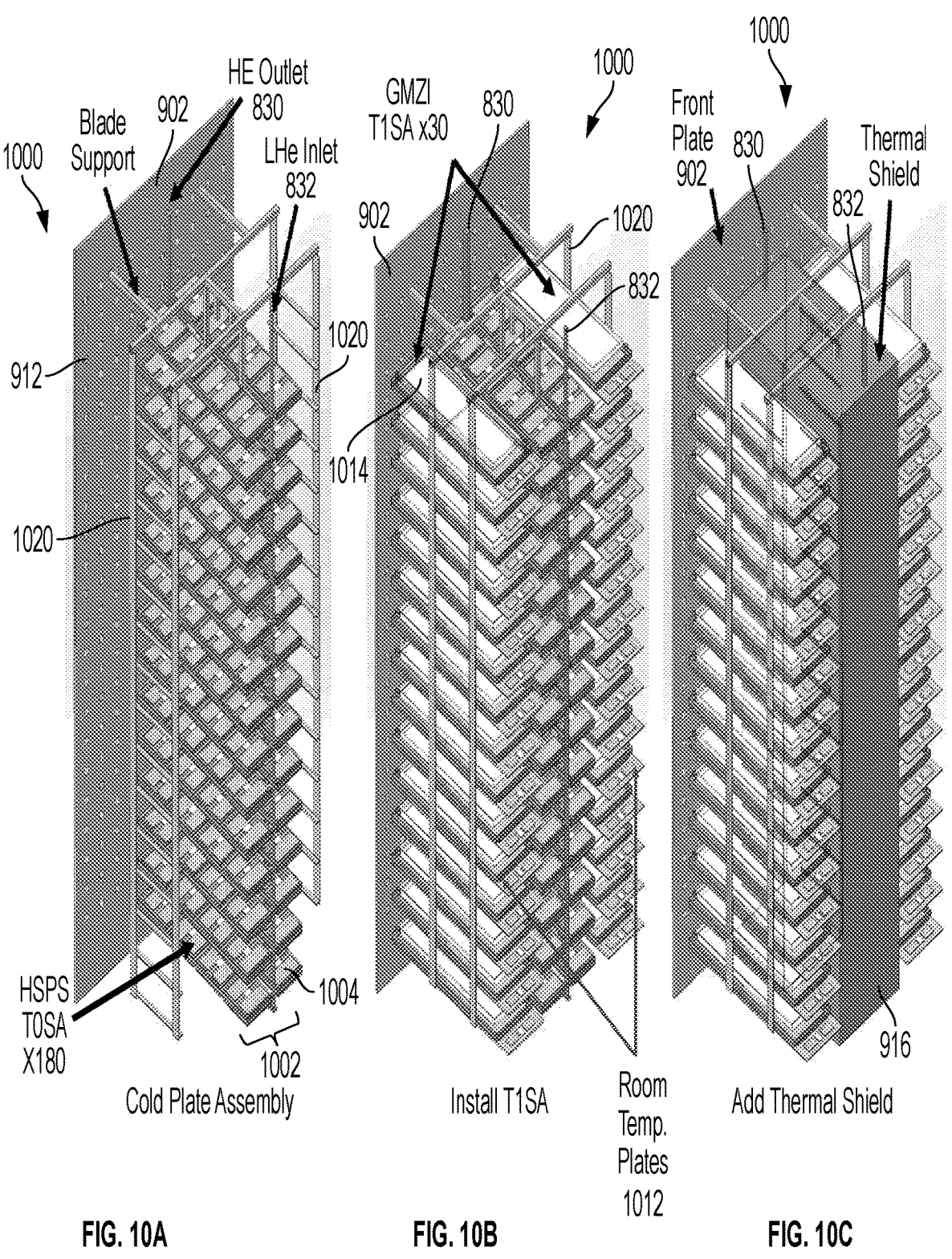
FIGS. 10A-10C show example horizontal blade configurations, in accordance with some example embodiments.

FIGS. 10A-10C show a horizontal blade tower 1000 of a cryo-cabinet rack system, in accordance with some example embodiments. FIG. 10A shows the horizontal mounted cryogenic blade 1002 (e.g., horizontal cold plate assembly). FIG. 10B shows the installation of the higher temperature electronics on horizontal room temperature blades 1012 (e.g., horizontal plates). In some example embodiments, the horizontal structure further includes a metal frame 1020 to support the horizontal chip mounts of the cold plate blade and the higher temperature (e.g., room temperature blade).

FIG. 10C shows the installation of the liquid nitrogen cooled thermal shield 916. In this embodiment, many more cryo-chips (e.g., die, photonics chip 1017, chip sub-assemblies) can be installed on the horizontal blade 1002 (e.g., horizontal cold plat assembly comprising horizontal mounting cold plates), although this requires a lower heat load for each die (e.g., photonics chip 1017). In other respects, the basic structure is same as the first embodiment, with the exception that the horizontal mounting cold plates 1004 (e.g., metal horizontal shelf structures attached to cold plate) are arranged approximately horizontally rather than vertically as in FIG. 9A-9C. In this embodiment of FIG. 10A-10C, the cryo-chips are installed on both upper and bottom surfaces of the smaller horizontal mounting cold plates 1004 which have a slight incline angle between liquid helium inlet 832 and helium outlet 830. The room temperature chips are installed horizontally next to the cryogenic chips (e.g., a plurality of chips, photonics chip 1017) with a thermal shield in between.

Figure 11:
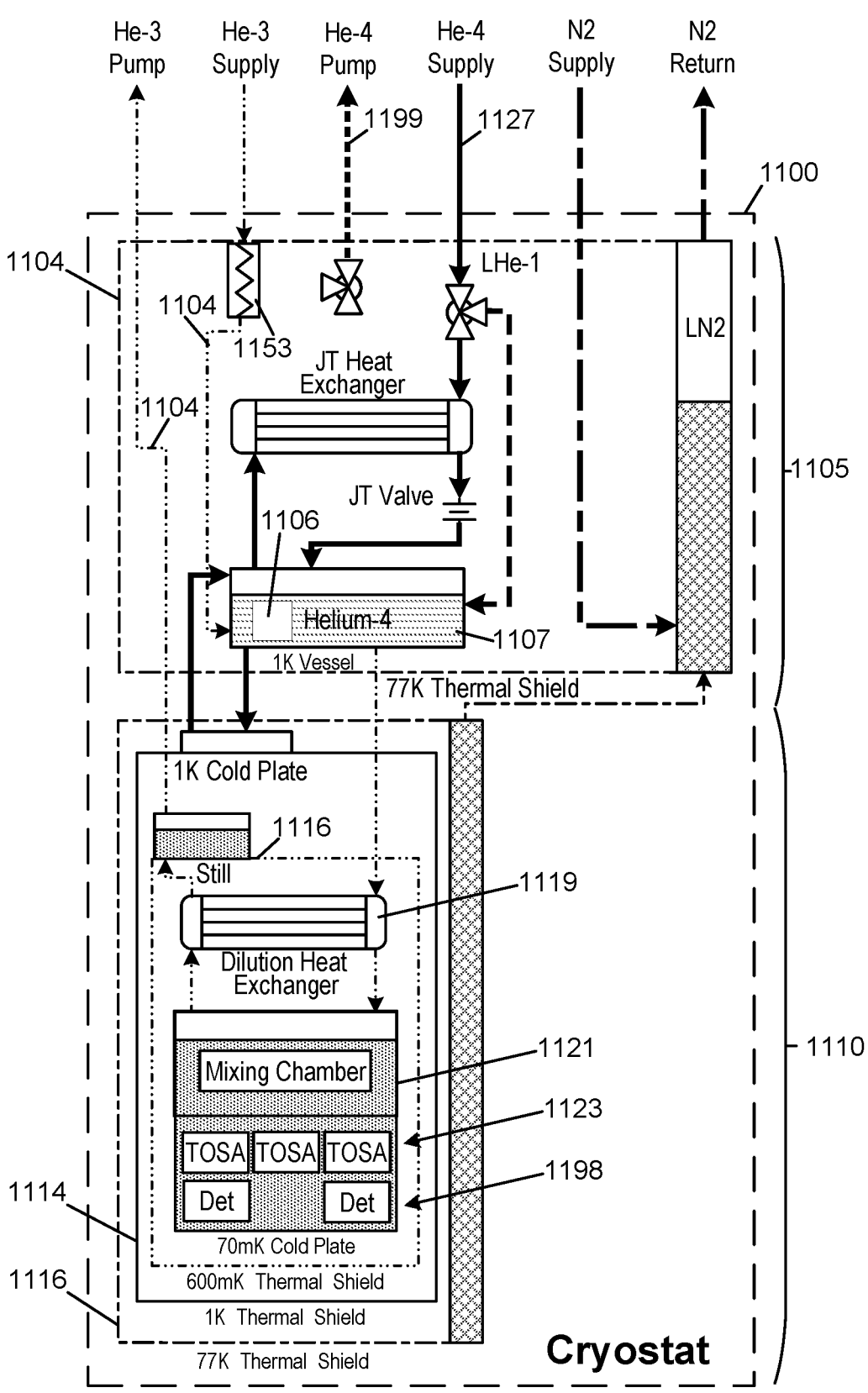
FIG. 11 shows an example dilution refrigeration blade system, in accordance with some example embodiments.

FIG. 11 shows a dilution refrigeration cryo-blade cabinet rack 1100, in accordance with some example embodiments. In the dilution refrigeration cryo-blade cabinet rack 1100 of FIG. 11, the distribution top section 1105 includes control systems to distribute the cryo-fluids to a tower cabinet section 1110 that houses one or more blade towers. In the embodiment of FIG. 11, multiple thermal shields at different temperatures are implemented. The dilution configuration of FIG. 11 can implement a flow process that is similar to a "wet" dilution refrigerator. In the distribution top section 1105, the helium-4 vessel 1107 (e.g., helium-4 bath) is pumped to a lower temperature (e.g., 1.2K) than the embodiments discussed above (e.g., FIGS. 9A-9C, FIGS. 10A-10C, operating at 2.2K). The helium-3 is cycled and pumped into the dilution refrigeration cryo-blade cabinet rack 1100 through a Helium-3 inlet 1179 and outlet 1178, independent from the helium-4 lines: a helium-4 inlet 1127 and helium-4 outlet 1199 (e.g., the latter being connected to a Helium pump), in accordance with some example embodiments.

In accordance with some embodiments, the helium-3 is pre-cooled in a helium-3 vessel 1153 by liquid nitrogen pipes that cool the thermal shield 1104. The helium-3 flows through the heat exchanger 1106 inside the main liquid helium-4 vessel 1107. The helium-3 temperature at the outlet of this heat exchanger is around 1.3K. Helium-3 is also cooled by the still thermal shield 1116 (~600 mK). Then, the helium-3 is further cooled by the exhausting helium-3 gas in the dilution heat exchanger 1119 to 70 mK. In some embodiments, the mixing chamber 1121 functions at 50 mK to 70 mK, with a cooling capacity of approximately 800 µW. The cryo-chips 1123 (e.g., TOSAs, single photon source PICs, detector PICs) are installed on the copper-made cold plate 1198, which is attached to the bottom surface of the mixing chamber 1121. In some embodiments, the optical fibers and electrical wiring are thermal lagged on each thermal shield (e.g., a 660 mk to 1 k thermal shield 1114, 77 k thermal shield 1112).

Figure 12A:
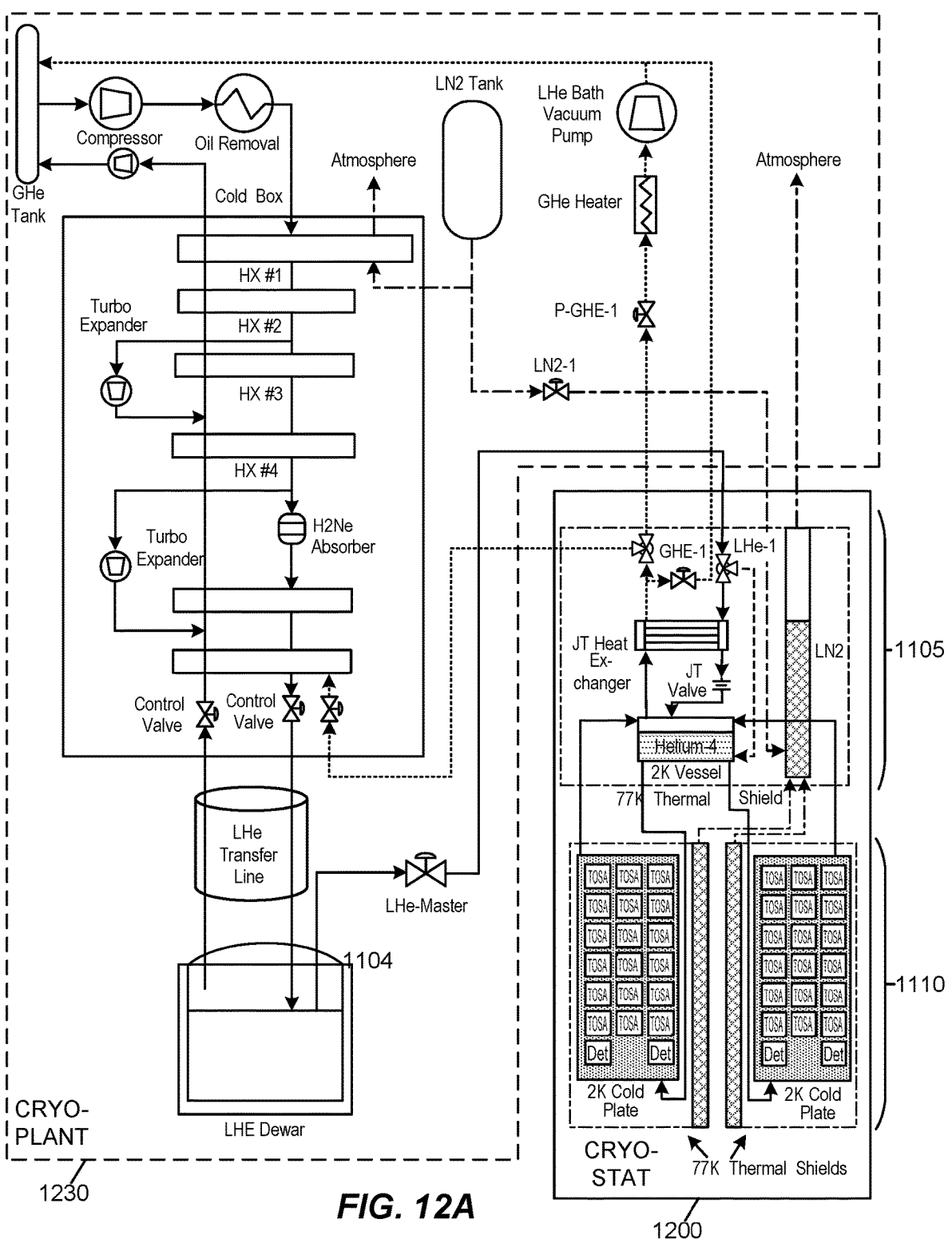
FIG. 12A shows a cryoplant providing fluids to a blade system, in accordance with some example embodiments.
Figure 12B:
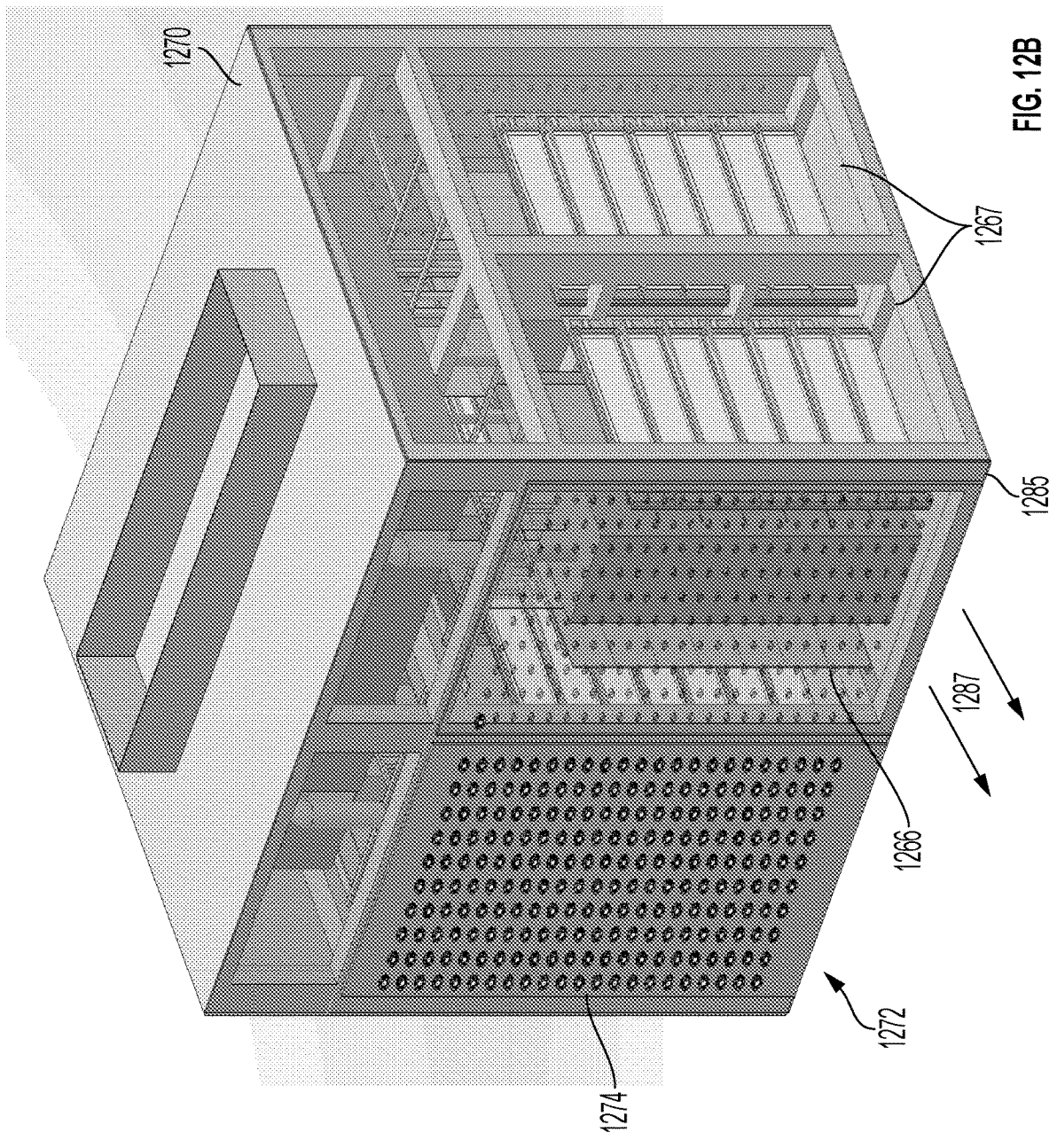
FIG. 12B shows an example blade rack system with four blade tower cabinets, in accordance with some example embodiments.

FIGS. 12A and 12B show examples of the cabinet system with blades and cryo-fluids provided by a cryo-plant, in accordance with some example embodiments. The flow diagram in FIG. 12A shows a how a cabinet rack system 1200 connects to a cryoplant 1230 with the cryo-blade of the first embodiment of FIGS. 9A-9C (e.g., helium-4 configuration) in a cryo-system, in accordance with some example embodiments, where the cabinet system 1200 includes a tower section 1210 and a distribution top section 1205 that are in respective thermally shielded enclosures.

FIG. 12B shows an example cryogenic cabinet rack system 1270 in which side panels 1267 and a front panel 1266 of the perspective view of the system in FIG. 12B are transparent for illustrative purposes. The cryogenic cabinet rack system 1270 houses four separate blade towers, such as blade tower 1285. In some example embodiments, to install or remove components or the entire blade tower 1285, the front panel is removed. For example, the front panel 1266 can be removed (e.g., fasteners unscrewed, after venting the vacuum of the cryogenic cabinet rack system 1270 as discussed above, via a vent) to remove or otherwise access the tower 1285. The tower cabinet 1285 is then accessed with the panel removed. In some example embodiments, the tower cabinet 1285 is installed on rails and the tower cabinet slides along the rails in the direction of arrows 1287. As an additional example, to access the tower adjacent to the tower 1285, another front panel 1274 (not transparent in FIG. 12)

of one of the additional cabinets 1272 can be removed and the tower components or tower cabinet itself can be installed or removed in a similar manner. In some example embodiments, each tower (e.g., tower 1285) is an enclosed cabinet that has a metal shell that separates it from other towers in the rack system 1270. In some example embodiments, each tower is an open cabinet, where the cabinet includes the metal support structures and the cryo and room temperature blades. In the open cabinet configuration, all four cabinets share the same vacuum chamber space within the rack system 1270 (e.g., when vacuum pumped, all four open cabinet towers are pumped at the same time). In some example embodiments, the rack system 1270 includes dividing walls that separate each tower cabinet into its own area.

In some example embodiments, the cryo-cabinet rack system can be configured with any of the example blade embodiments discussed above (e.g., the embodiments of (a) FIGS. 9A-C, (b) FIGS. 10A-10C, and (c) FIG. 11 have the same form factor and connectors such that different blade embodiments can be switched in and out in a single cryo-cabinet rack system). In some example embodiments, a single cryo-cabinet rack system may have different combinations of blade types within the same cryogenic cabinet rack system (e.g., cryogenic cabinet rack system 800, FIG. 8; cryogenic cabinet rack system 1270, FIG. 12B).

The devices and methods of the alternative embodiments have the following non-limiting advantages. The cryo-cabinet rack system is modularized to provide custom fit for different cooling and temperature requirements, from 2.2K to 70 mK. The cryo-cabinet rack system provides high density cryo-genic housing for chips per volume (e.g., 900 or more chips per cryo-cabinet rack system). The cryo-cabinet rack system has a higher cooling capacity (e.g., ~200 W @ 2.2K) than other approaches (e.g., ~3 W @ 2.2K). The cryo-cabinet rack system enables both room temperature and cryogenic electronic and optical sub-assemblies in a single vacuum chamber, thereby reducing the number of hermetic interconnects as compared to other approaches. Further, the room temperature and cryogenic electronic and optical sub-assemblies (e.g., blades) are closely located for reduced latency when communicating between sub-assemblies across the two temperature regimes. Further, the cryo-cabinet rack system includes easy-to-access panels to access a given tower in a cabinet, and each tower cabinet can be configured with a moveable track to facilitate assembly and maintenance. The cryo-cabinet rack system can be configured to have rack mount form factor (e.g., four 48 RU racks). For example, each of the four towers in cryogenic cabinet rack system 1270 can be configured as a structure that has a similar or same shape and size as a rack mount enclosure (e.g., server rack; 36 RU) 42 RU, 45 RU, 48 RU rack; width of 24 to 40 inches, height of 70 to 100 inches, depth of 40 to 50 inches) for installation a plurality of cryo-cabinet rack systems into a data center.

The following are example embodiments:

Example 1: A cryogenic quantum computer data center rack system, comprising: a cabinet; a cryogenic blade in the cabinet, the cryogenic blade supporting a plurality of photonic chips, the cryogenic blade thermally coupled to a cryogenic pipe operable to circulate a cryogenic fluid to cool the plurality of photonic chips to a cryogenic temperature; and a plurality of room temperature blades in the cabinet, each room temperature blade supporting control chips to operate at a room temperature that is higher than the cryogenic temperature.

Example 2: The cryogenic quantum computer data center rack system of Example 1, wherein the plurality of room temperature blades are thermally coupled to cooling pipes to receive a non-cryogenic fluid for cooling the control chips.

Example 3: The cryogenic quantum computer data center rack system of Example 1 or Example 2, wherein the non-cryogenic fluid comprises water.

Example 4: The cryogenic quantum computer data center rack system of any one of Examples 1-3, wherein the cryogenic fluid comprises helium.

Example 5: The cryogenic quantum computer data center rack system of any one of Examples 1-4, wherein The cryogenic quantum computer data center rack system is in an environment having an ambient temperature and the room temperature of the plurality of room temperature blades is cooler than the ambient temperature of the environment.

Example 6: The cryogenic quantum computer data center rack system of any one of Examples 1-5, further comprising a thermal shield located in the cabinet to separate the cryogenic blade from the plurality of room temperature blades.

Example 7: The cryogenic quantum computer data center rack system of any one of Examples 1-6, wherein the plurality of room temperature blades comprises a first room temperature blade and a second room temperature blade, wherein the first room temperature blade is separated from the second room temperature blade by the cryogenic blade, wherein the cryogenic blade is in the thermal shield and the thermal shield separates the first room temperature blade from the second room temperature blade.

Example 8: The cryogenic quantum computer data center rack system of any one of Examples 1-7, wherein the cryogenic pipe is a first cryogenic pipe, wherein the cryogenic fluid is a first cryogenic fluid that cools the plurality of photonic chips to a first cryogenic temperature, and wherein the cryogenic quantum computer data center rack system further comprises a second cryogenic pipe to circulate a second cryogenic fluid that is different from the first cryogenic fluid, and wherein the second cryogenic pipe is thermally coupled to the thermal shield to cool the thermal shield to a second cryogenic temperature that is higher than the first cryogenic temperature.

Example 9: The cryogenic quantum computer data center rack system of any one of Examples 1-8, wherein the first cryogenic fluid comprises liquid helium and the second cryogenic fluid comprises liquid nitrogen.

Example 10: The cryogenic quantum computer data center rack system of any one of Examples 1-9, wherein the first cryogenic temperature is 2 degrees Kelvin and the second cryogenic temperature of the second cryogenic fluid is 77 degrees Kelvin.

Example 11: The cryogenic quantum computer data center rack system of any one of Examples 1-10, comprising a vacuum chamber that comprises the cabinet, wherein the vacuum chamber places the cabinet, the cryogenic blade, and the plurality of room temperature blades in a vacuum.

Example 12: The cryogenic quantum computer data center rack system of any one of Examples 1-11, wherein the vacuum chamber comprises a plurality of additional cabinets, each additional cabinet comprising an additional cryogenic blade to support an additional plurality of photonic chips to operate at the cryogenic temperature, each additional cabinet further comprising an additional plurality of room temperature blades supporting additional control chips to operate at the room temperature.

Example 13: The cryogenic quantum computer data center rack system of any one of Examples 1-12, wherein the cabinet comprises an access panel for access to the cryogenic blade and the plurality of room temperature blades.

Example 14: The cryogenic quantum computer data center rack system of any one of Examples 1-13, wherein the access panel comprises a plurality of vacuum feedthroughs, wherein a vacuum feedthrough comprises data interconnects.

Example 15: The cryogenic quantum computer data center rack system of any one of Examples 1-14, wherein the data interconnects comprise optical interconnects and electrical interconnects.

Example 16: The cryogenic quantum computer data center rack system of any one of Examples 1-15, wherein The cryogenic quantum computer data center rack system is placed on a ground and the cabinet is a cabinet tower, wherein the cryogenic blade and the plurality of room temperature blades are blade towers arranged in the cabinet tower.

Example 17: The cryogenic quantum computer data center rack system of any one of Examples 1-16, wherein the cryogenic blade extends in a vertical direction and wherein the plurality of photonic chips are vertically mounted to the cryogenic blade.

Example 18: The cryogenic quantum computer data center rack system of any one of Examples 1-17, wherein the cryogenic blade extends in a vertical direction, and wherein the cryogenic blade further comprises a plurality of horizontal support structures, wherein the plurality of photonic chips are horizontally mounted on the plurality of horizontal structures.

Example 19: The cryogenic quantum computer data center rack system of any one of Examples 1-18, wherein the plurality of photonic chips comprises one or more of: photonic integrated circuit photon detectors, photonic integrated circuit switches.

Example 20: The cryogenic quantum computer data center rack system of any one of Examples 1-19, wherein the control chips comprises one or more of: electronic integrated circuits, photonic integrated circuit switches.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A cryogenic cabinet rack system, comprising:

a cabinet;

a cryogenic blade in the cabinet, the cryogenic blade supporting a plurality of photonic chips, the cryogenic blade thermally coupled to a cryogenic pipe operable to circulate a cryogenic fluid to cool the plurality of photonic chips to a cryogenic temperature; and a plurality of room temperature blades in the cabinet, each room temperature blade supporting control chips to operate at a room temperature that is higher than the cryogenic temperature.

2. The cryogenic cabinet rack system of claim 1, wherein the plurality of room temperature blades are thermally coupled to cooling pipes to receive a non-cryogenic fluid for cooling the control chips.

3. The cryogenic cabinet rack system of claim 2, wherein the non-cryogenic fluid comprises water.

4. The cryogenic cabinet rack system of claim 1, wherein the cryogenic fluid comprises helium.

5. The cryogenic cabinet rack system of claim 1, wherein the cryogenic cabinet rack system is in an environment having an ambient temperature and the room temperature of the plurality of room temperature blades is cooler than the ambient temperature of the environment.

6. The cryogenic cabinet rack system of claim 1, further comprising a thermal shield located in the cabinet to separate the cryogenic blade from the plurality of room temperature blades.

7. The cryogenic cabinet rack system of claim 6, wherein the plurality of room temperature blades comprises a first room temperature blade and a second room temperature blade, wherein the first room temperature blade is separated from the second room temperature blade by the cryogenic blade, wherein the cryogenic blade is in the thermal shield and the thermal shield separates the first room temperature blade from the second room temperature blade.

8. The cryogenic cabinet rack system of claim 6, wherein the cryogenic pipe is a first cryogenic pipe, wherein the cryogenic fluid is a first cryogenic fluid that cools the plurality of photonic chips to a first cryogenic temperature, and wherein the cryogenic cabinet rack system further comprises a second cryogenic pipe to circulate a second cryogenic fluid that is different from the first cryogenic fluid, and wherein the second cryogenic pipe is thermally coupled to the thermal shield to cool the thermal shield to a second cryogenic temperature that is higher than the first cryogenic temperature.

9. The cryogenic cabinet rack system of claim 8, wherein the first cryogenic fluid comprises liquid helium and the second cryogenic fluid comprises liquid nitrogen.

10. The cryogenic cabinet rack system of claim 8, wherein the first cryogenic temperature is 2 degrees Kelvin and the second cryogenic temperature of the second cryogenic fluid is 77 degrees Kelvin.

11. The cryogenic cabinet rack system of claim 1, comprising a vacuum chamber that comprises the cabinet, wherein the vacuum chamber places the cabinet, the cryogenic blade, and the plurality of room temperature blades in a vacuum.

12. The cryogenic cabinet rack system of claim 11, wherein the vacuum chamber comprises a plurality of additional cabinets, each additional cabinet comprising an additional cryogenic blade to support an additional plurality of photonic chips to operate at the cryogenic temperature, each additional cabinet further comprising an additional plurality of room temperature blades supporting additional control chips to operate at the room temperature.

13. The cryogenic cabinet rack system of claim 11, wherein the cabinet comprises an access panel for access to the cryogenic blade and the plurality of room temperature blades.

14. The cryogenic cabinet rack system of claim 13, wherein the access panel comprises a plurality of vacuum feedthroughs, wherein a vacuum feedthrough comprises data interconnects.

15. The cryogenic cabinet rack system of claim 14, wherein the data interconnects comprise optical interconnects and electrical interconnects.

16. The cryogenic cabinet rack system of claim 1, wherein the cryogenic cabinet rack system is placed on a ground and the cabinet is a cabinet tower, wherein the cryogenic blade and the plurality of room temperature blades are blade towers arranged in the cabinet tower.

17. The cryogenic cabinet rack system of claim 16, wherein the cryogenic blade extends in a vertical direction and wherein the plurality of photonic chips are vertically mounted to the cryogenic blade.

18. The cryogenic cabinet rack system of claim 16, wherein the cryogenic blade extends in a vertical direction, and wherein the cryogenic blade further comprises a plurality of horizontal support structures, wherein the plurality of photonic chips are horizontally mounted on the plurality of horizontal structures.

19. The cryogenic cabinet rack system of claim 1, wherein the plurality of photonic chips comprises one or more of: photonic integrated circuit photon detectors or photonic integrated circuit switches.

20. The cryogenic cabinet rack system of claim 1, wherein the control chips comprise one or more of: electronic integrated circuits or photonic integrated circuit switches.

* * * * *